US012266664B2

(12) United States Patent
Choi et al.

(10) Patent No.: US 12,266,664 B2
(45) Date of Patent: Apr. 1, 2025

(54) DISPLAY DEVICE HAVING AN INSULATING LAYER CONTACTING A SEMICONDUCTOR LAYER THROUGH A CONTACT HOLE

(71) Applicant: Samsung Display Co., Ltd., Yongin-Si (KR)

(72) Inventors: Seon Young Choi, Gunpo-si (KR); Jae Hyung Cho, Suwon-si (KR); Jee Hoon Sim, Yongin-si (KR); Jun Ki Jeong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/402,379

(22) Filed: Jan. 2, 2024

(65) Prior Publication Data

US 2024/0136368 A1 Apr. 25, 2024
US 2024/0234445 A9 Jul. 11, 2024

Related U.S. Application Data

(62) Division of application No. 17/519,485, filed on Nov. 4, 2021, now Pat. No. 11,908,874.

(30) Foreign Application Priority Data

Mar. 23, 2021 (KR) .......................... 10-2021-0037418

(51) Int. Cl.
*H01L 27/12* (2006.01)
*G02F 1/1333* (2006.01)
(Continued)

(52) U.S. Cl.
CPC .... *H01L 27/1248* (2013.01); *G02F 1/133345* (2013.01); *G02F 1/136227* (2013.01);
(Continued)

(58) Field of Classification Search
CPC .................... G02F 1/133345; G02F 1/136227
See application file for complete search history.

(56) References Cited

U.S. PATENT DOCUMENTS 11,101,336 B2   8/2021  Jeong et al.
2019/0206958 A1*  7/2019  Lee ...................... H10K 59/123

FOREIGN PATENT DOCUMENTS

EP       3537481 A1       9/2019
KR    10-1155907 B1       6/2012
(Continued)

*Primary Examiner* — Lauren Nguyen
(74) *Attorney, Agent, or Firm* — Innovation Counsel LLP

(57) ABSTRACT

An embodiment of a display device includes a substrate, a semiconductor layer, a first gate insulating layer, a gate electrode, a second gate insulating layer, a first storage electrode, a first interlayer insulating layer, a second interlayer insulating layer, a data line, and a driving voltage line. The semiconductor layer is disposed on the substrate. The first gate insulating layer is disposed on the semiconductor layer. The gate electrode is positioned on the first insulating layer. The second gate insulating layer is disposed on the gate electrode. The first storage electrode is positioned on the second gate insulating layer. The first interlayer insulating layer is disposed on the first storage electrode and has an opening surrounding the semiconductor layer, the gate electrode, and the first storage electrode. The second interlayer insulating layer is disposed on the first interlayer insulating layer and fills the opening. The data line and the driving voltage line are positioned on the second interlayer insulating layer. The semiconductor layer, the gate electrode, and the storage electrode are included in a pixel region. The display device includes a plurality of pixel regions. The data line and the driving voltage line cross the pixel circuit region. A portion of the semiconductor layer is in contact with the second interlayer insulating that fills the opening.

8 Claims, 29 Drawing Sheets

(51) Int. Cl.
    *G02F 1/1362*     (2006.01)
    *H01L 27/15*     (2006.01)
    *H10K 59/121*     (2023.01)
    *H10K 59/124*     (2023.01)
    *H10K 102/00*     (2023.01)

(52) U.S. Cl.
    CPC ........ *H01L 27/1225* (2013.01); *H01L 27/124* (2013.01); *H01L 27/1255* (2013.01); *H01L 27/156* (2013.01); *H10K 59/1213* (2023.02); *H10K 59/124* (2023.02); *H10K 2102/311* (2023.02)

(56) References Cited

FOREIGN PATENT DOCUMENTS

| | | | |
|---|---|---|---|
| KR | 10-2020-0016425 | A | 2/2020 |
| KR | 10-2020-0069436 | A | 6/2020 |
| KR | 10-2020-0113055 | A | 10/2020 |

\* cited by examiner

DISPLAY DEVICE HAVING AN INSULATING LAYER CONTACTING A SEMICONDUCTOR LAYER THROUGH A CONTACT HOLE

CROSS-REFERENCE TO RELATED APPLICATION

This application is a divisional application of U.S. patent application Ser. No. 17/519,485, filed on Nov. 4, 2021, now U.S. Pat. No. 11,908,874, which claims priority to and the benefit of Korean Patent Application No. 10-2021-0037418, filed in the Korean Intellectual Property Office on Mar. 23, 2021, the entire contents of which are incorporated herein by reference in their entireties.

BACKGROUND

(a) Field

The present disclosure relates to a display device.

(b) Description of the Related Art

A display device serves to display a screen, and includes a liquid crystal display, an emissive display device, and the like. Such a display device is used in various electronic devices such as mobile phones, navigation units, digital cameras, electronic books, portable game machines, and various terminals.

The emissive display device includes two electrodes and an emission layer positioned therebetween, and electrons injected from one of the two electrodes and holes injected from the other electrode are combined in the emission layer to form excitons. Excitons output energy and emit light while changing from an excited state to a ground state.

The emissive display includes a plurality of pixels including a light emitting diode that is a self-emission element, and a plurality of transistors and one or more capacitors are formed in each pixel to drive the light emitting diode.

SUMMARY

An embodiment of a display device includes a substrate, a semiconductor layer, a first gate insulating layer, a gate electrode, a second gate insulating layer, a first storage electrode, a first interlayer insulating layer, a second interlayer insulating layer, a data line, and a driving voltage line. The semiconductor layer is disposed on the substrate. The first gate insulating layer is disposed on the semiconductor layer. The gate electrode is positioned on the first insulating layer. The second gate insulating layer is disposed on the gate electrode. The first storage electrode is positioned on the second gate insulating layer. The first interlayer insulating layer is disposed on the first storage electrode and has an opening surrounding the semiconductor layer, the gate electrode, and the first storage electrode. The second interlayer insulating layer is disposed on the first interlayer insulating layer and fills the opening. The data line and the driving voltage line are positioned on the second interlayer insulating layer. The semiconductor layer, the gate electrode, and the storage electrode are included in a pixel region. The display device includes a plurality of pixel regions. The data line and the driving voltage line cross the pixel circuit region. A portion of the semiconductor layer is in contact with the second interlayer insulating that fills the opening.

The opening may be formed to surround an edge of each of the pixel circuit regions, while the pixel circuit regions may be divided by the opening.

A cross-section width of the opening may decrease toward the substrate.

The display device may further include a buffer layer positioned between the substrate and the semiconductor layer, and the opening may extend through the first interlayer insulating layer, the second gate insulating layer, the first gate insulating layer, and the buffer layer.

The display device may further include a barrier layer positioned between the substrate and the buffer layer, and the opening may extend to the barrier layer.

The opening may extend through the barrier layer.

Semiconductor layers may be spaced apart from each other by the opening in adjacent pixel circuit regions.

The second interlayer insulating layer may fill the opening, and may be spaced apart from the semiconductor layer, the gate electrode, and the first storage electrode.

The display device may further include: a plurality of transistors positioned on the substrate; and a first lower scan line, a second lower scan line, and a lower emission control line connected to at least one of the transistors, and the first lower scan line, the second lower scan line, and the lower emission control line may be positioned within one pixel circuit region.

First lower scan lines positioned in different pixel circuit regions may be positioned to be spaced apart from each other, second lower scan lines positioned in different pixel circuit regions may be positioned to be spaced apart from each other, and lower emission control lines positioned in different pixel circuit regions may be positioned to be spaced apart from each other.

The display device may further include an first upper scan line, an upper second scan line, and an upper emission control line positioned on the second interlayer insulating layer, the first upper scan line may be connected to the first lower scan lines positioned within the different pixel circuit regions, the upper second scan line may be connected to the second lower scan lines positioned within the different pixel circuit regions, and the upper emission control line may be connected to the lower emission control lines positioned in the different pixel circuit regions.

The display device may further include: an anode configured to be connected to at least one of the transistors; a light emitting diode layer disposed on the anode; and a cathode positioned on the light emitting diode layer.

An embodiment of a display device includes a substrate, a polycrystalline semiconductor layer, a first gate insulating layer, a gate electrode, a second gate insulating layer, a first storage electrode, a first interlayer insulating layer, an oxide semiconductor layer, a second interlayer insulating layer, a third interlayer insulating layer, a data line, and a driving voltage line. The polycrystalline semiconductor layer is disposed on the substrate and includes a first electrode, a channel, and a second electrode of a driving transistor. The first gate insulating layer is disposed on the polycrystalline semiconductor layer. The gate electrode of the driving transistor is positioned on the first gate insulating layer. The second gate insulating layer is disposed on the gate electrode. The first storage electrode is positioned on the second gate insulating layer. The first interlayer insulating layer is disposed on the first storage electrode. The oxide semiconductor layer is disposed on the first interlayer insulating layer. The second interlayer insulating layer is disposed on the oxide semiconductor layer and includes an opening surrounding the polycrystalline semiconductor layer and the oxide semiconductor layer. The third interlayer insulating layer is configured to fill the opening of the second interlayer insulating layer. The data line and the driving voltage line are positioned on the third interlayer insulating layer. A portion of the polycrystalline semiconductor layer is in contact with third interlayer insulating layer filling the opening.

The display device may include a plurality of pixel circuit regions, each of the pixel circuit regions includes at least two polycrystalline semiconductor layers adjacent in a first direction, and the pixel circuit regions may be delimited by the opening.

A cross-section width of the opening may decrease toward the substrate.

The display device may further include a buffer layer positioned between the substrate and the semiconductor layer, and the opening may extend through the second interlayer insulating layer, the first interlayer insulating layer, the second gate insulating layer, the first gate insulating layer, and the buffer layer.

The display device may further include a barrier layer positioned between the substrate and the buffer layer, and the opening may extend to the barrier layer.

The opening may extend through the barrier layer.

The polycrystalline semiconductor layers may be spaced apart from each other by the opening in adjacent pixel circuit regions.

The display device may further include: a plurality of transistors positioned on the substrate; and a first lower scan line, a second lower scan line, and a lower emission control line connected to at least one of the transistors, the transistors, the first lower scan line, the second lower scan line, and the lower emission control may be positioned within the pixel circuit regions, first lower scan lines positioned in different pixel circuit regions may be positioned to be spaced apart from each other, second lower scan lines positioned in different pixel circuit regions may be positioned to be spaced apart from each other, and lower emission control lines positioned in different pixel circuit regions may be positioned to be spaced apart from each other, and wherein the display device may further include an first upper scan line, an upper second scan line, and an upper emission control line positioned on the third interlayer insulating layer, the first upper scan line may be connected to the first lower scan lines positioned within the different pixel circuit regions, the upper second scan line may be connected to the second lower scan lines positioned within the different pixel circuit regions, and the upper emission control line may be connected to the lower emission control lines positioned in the different pixel circuit regions.

DETAILED DESCRIPTION OF THE EMBODIMENTS

Figure 1:
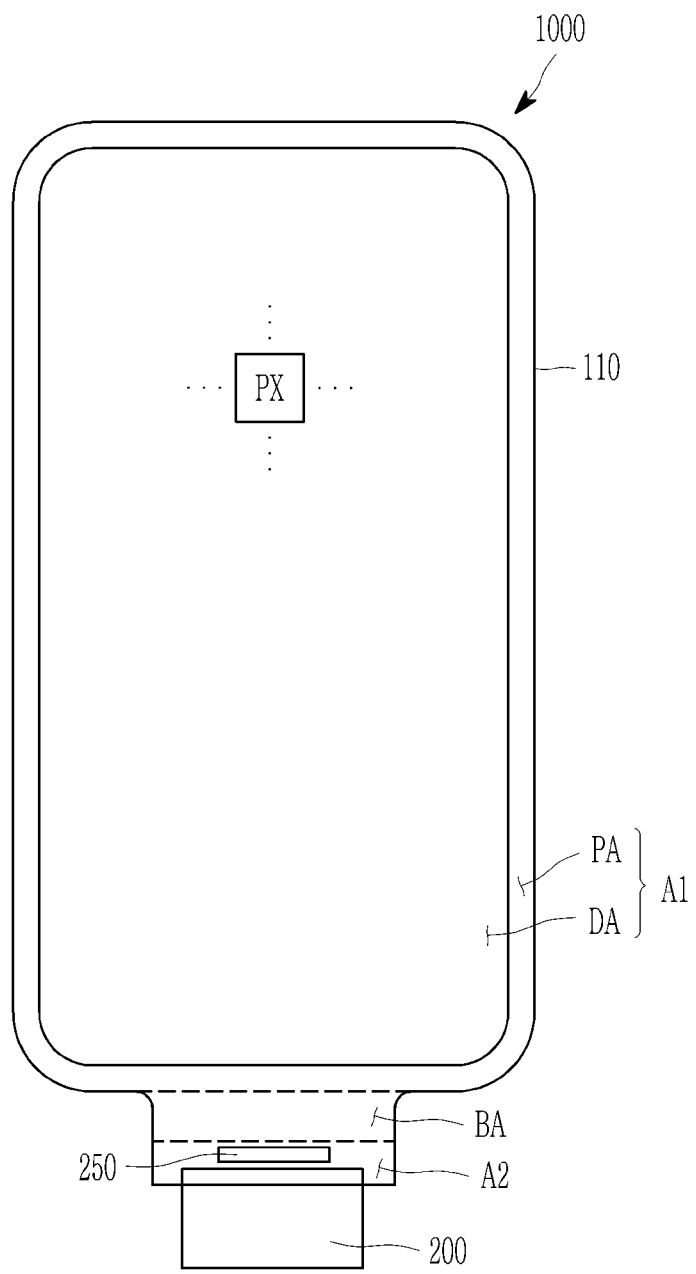
FIG. 1 illustrates a top plan view of a display device according to an embodiment.

Embodiments have been made in an effort to provide a display device with improved reliability while reducing an effect of external impact.

According to the embodiments, it is possible to prevent damage in some areas from propagating to other areas due to external impact. In addition, it is possible to minimize damage to pixels due to electrostatic discharge.

The present invention will be described more fully hereinafter with reference to the accompanying drawings, in which embodiments of the invention are shown. As those skilled in the art would realize, the described embodiments may be modified in various different ways, all without departing from the spirit or scope of the present invention.

To clearly describe the present invention, parts that are irrelevant to the description are omitted, and like numerals refer to like or similar constituent elements throughout the specification.

Further, since sizes and thicknesses of constituent members shown in the accompanying drawings are arbitrarily given for better understanding and ease of description, the present invention is not limited to the illustrated sizes and thicknesses. In the drawings, the thicknesses of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" and the word "include" and variations such as "includes" and "including" will be understood to imply the inclusion of stated elements but not the exclusion of any other elements.

Further, in the specification, the phrase "in a plan view" means when an object portion is viewed from above, and the phrase "in a cross-sectional view" means when a cross-section taken by vertically cutting an object portion is viewed from the side.

As used herein, the word "or" means logical "or" so that, unless the context indicates otherwise, the expression "A, B, or C" means "A and B and C," "A and B but not C," "A and C but not B," "B and C but not A," "A but not B and not C," "B but not A and not C," and "C but not A and not B."

Next, a display device according to an embodiment will be described with reference to FIG. 1. FIG. 1 illustrates a top plan view of a display device according to an embodiment.

As illustrated in FIG. 1, according to the present embodiment, the display device 1000 includes a substrate 110 and a plurality of pixels PX positioned on the substrate 110.

The substrate 110 includes a first area A1, a second area A2, and a bending area BA positioned between the first area A1 and the second area A2. The substrate 110 may be made of a flexible material, and may be changed in various forms. The substrate 110 may be flexible, stretchable, foldable, bendable, or rollable. The bending area BA may be an area where the substrate 110 is bendable. The first area A1 and the second area A2 may be formed to have a flat shape. However, this is only an example, and the substrate 110 may additionally include an area to be bendable. For example, at least a portion of the first area A1 or the second area A2 of the substrate 110 may be bendable.

The first area A1 of the substrate 110 extends from the bending area BA. The first area A1 may be formed in a substantially rectangular shape including a long side and a short side, and may have a shape having a curved surface by chamfering a corner portion. However, the shape of the first area A1 is only an example, and may be modified into various shapes. The first area A1 may include a display area DA and a peripheral area PA. The display area DA may be positioned in a central portion of the first area A1, and may have a shape that is substantially similar to that of the first area A1. The periphery area PA may surround the display area DA. That is, the peripheral area PA may be positioned in an outer portion of the first area A1.

The pixels PX may be positioned in the display area DA. The pixels PX may be arranged in a matrix form to receive an image signal and accordingly display an image. In this case, an arrangement shape of the pixels PX may be variously changed. Although not illustrated, the display device according to an embodiment may further include a plurality of signal lines. The signal lines may include a plurality of scan lines, a plurality of emission control lines, a plurality of data lines, a plurality of driving voltage lines, and the like. These signal lines may transmit a scan signal, a light emission control signal, a data signal, a driving voltage, and the like. The signal lines may be positioned to cross each other in a row direction or a column direction. In addition, each pixel PX may include a plurality of transistors, capacitors, and at least one light emitting diode connected to a plurality of signal lines. That is, the display device according to the embodiment may be formed as an emissive display device. However, a type of the display device is not limited thereto, and may be formed as various types of display devices. For example, the display device may be formed as a liquid crystal display, an electrophoretic display, an electrowetting display device, or the like.

The second area A2 of the substrate 110 extends from the bending area BA. The second area A2, which is a non-display area that does not display an image, does not include the pixel PX. Elements or wires for generating or transferring various signals applied to the pixels PX are positioned in the second area A2.

A driving circuit chip 250 and a flexible circuit board 200 may be positioned on the second area A2. The driving circuit chip 250 is connected to the elements or the wires located in the second area A2 to transfer various signals to the pixels PX. For example, the driving circuit chip 250 may supply a scan signal, a control signal, and a data signal. The flexible circuit board 200 may be attached to an edge of the second area A2 of the substrate 110. The flexible circuit board 200 may be made of a flexible material. A circuit for controlling driving of a display device is designed in the flexible circuit board 200.

The bending area BA of the substrate 110 is positioned between the first area A1 and the second area A2 to connect the first area A1 and the second area A2. When the substrate 110 is bent, the first area A1 and the second area A2 may overlap each other. The bending area BA of the substrate 110 may be positioned to be connected to a short side of one side of the first area A1. However, such a position of the bending area BA is merely an example, and may be variously changed. For example, the bending area BA may be positioned to be connected to opposite short sides of the first area A1, or may be positioned to be connected to the long sides.

Figure 2:
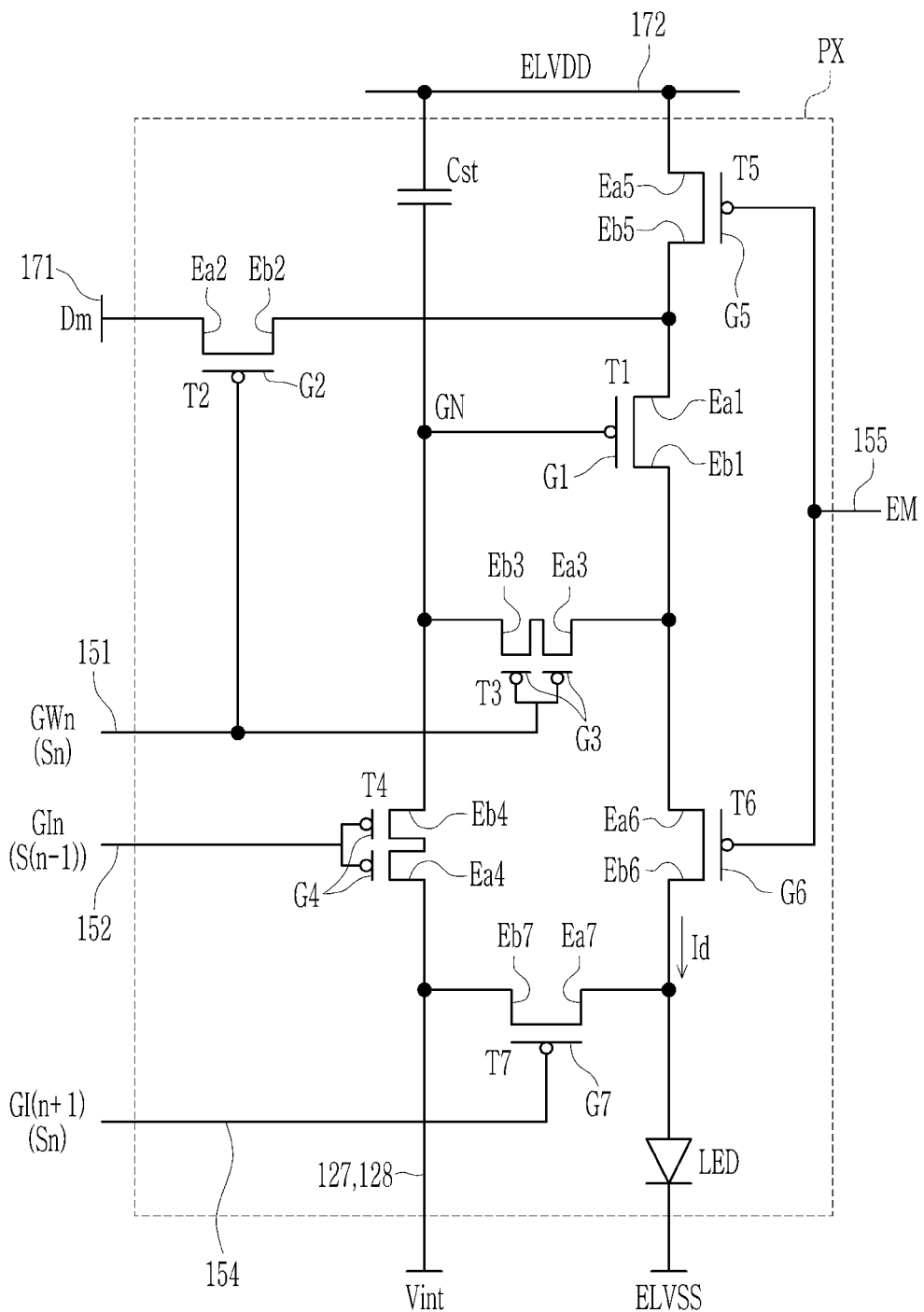
FIG. 2 illustrates a circuit diagram of a pixel of a display device according to an embodiment.

Hereinafter, one pixel of the display device according to an embodiment will be described with reference to FIG. 2. FIG. 2 illustrates a circuit diagram of a pixel of a display device according to an embodiment.

As illustrated in FIG. 2, the display device according to present embodiment includes a plurality of pixels PX displaying an image and a plurality of signal lines 127, 151, 152, 153, 154, 171, and 172. One pixel PX may include a plurality of transistors T1, T2, T3, T4, T5, T6, and T7, a capacitor Cst, and at least one light emitting diode (LED) connected to the signal lines 127, 151, 152, 153, 154, 171, and 172. In the present embodiment, an example in which one pixel PX includes one light emitting diode LED will be mainly described.

The signal lines 127, 151, 152, 154, 155, 171, and 172 may include an initialization voltage line 127, a plurality of scan lines 151, 152, and 154, an emission control line 155, a data line 171, and a driving voltage line 172.

The initialization voltage line 127 may transfer an initialization voltage Vint. The scan lines 151, 152, and 154 may transfer scan signals GWn, GIn, and GI(n+1), respectively. The scan signals GWn, Gin, and GI(n+1) may transfer a gate-on voltage and a gate-off voltage that can turn the transistors T2, T3, T4, and T7 included in the pixel PX on or off.

The scan lines 151, 152, and 154 connected to the pixel PX may include a first scan line 151 through which the scan signal Gin can be transferred, a second scan line 152 through which the scan signal GIn having a gate-on voltage can be transferred at a different time from that of the first scan line 151, and a third scan line 154 through which the scan signal GI(n+1) may be transferred. In the present embodiment, an example in which the second scan line 152 transfers the gate-on voltage at a time that is earlier than that of the first scan line 151 will be mainly described. For example, when the scan signal GWn is an $n^{th}$ scan signal Sn (n being a natural number that is equal to or greater than 1) among the scan signals applied during one frame, the scan signal GIn may be a previous-stage scan signal such as an $(n-1)^{th}$ scan signal, and the scan signal GI(n+1) may be an $(n+1)^{th}$ scan signal S(n+1). However, the present embodiment is not limited thereto, and the scan signal GI(n+1) may be a scan signal that is different from the $(n+1)^{th}$ scan signal S(n+1).

The emission control line 155 may transfer a control signal, and particularly may transfer an emission control signal EM capable of controlling emission of a light emitting diode LED included in the pixel PX. The control signal transferred by the emission control line 155 may transfer the gate-on voltage and the gate-off voltage, and may have a waveform that is different from that of the scan signal transferred by the scan lines 151, 152, and 154.

The data line 171 may transfer a data signal Dm, and the driving voltage line 172 may transfer a driving voltage ELVDD. The data signal Dm may have a different voltage level depending on an image signal inputted into the display device, and the driving voltage ELVDD may have a substantially constant level.

Although not illustrated, the display device may further include a driver that transfer signals to the signal lines 127, 151, 152, 153, 154, 171, and 172.

The transistors T1, T2, T3, T4, T5, T6, and T7 included in one pixel PX may include a first transistor T1, a second transistor T2, a third transistor T3, a fourth transistor T4, a fifth transistor T5, a sixth transistor T6, and a seventh transistor T7.

The first scan line 151 may transfer a scan signal GWn to the second transistor T2 and the third transistor T3, the second scan line 152 may transfer a scan signal GIn to the fourth transistor T4, the third scan line 154 may transfer a scan signal GI(n+1) to the seventh transistor T7, and the control line 153 may transfer an emission control signal EM to the fifth transistor T5 and the sixth transistor T6.

The gate electrode G1 of the first transistor T1 is connected to a first end of the capacitor Cst through a driving gate node GN, a first electrode S1 of the first transistor T1 is connected to the driving voltage line 172 via the fifth transistor T5, and a second electrode D1 of the first transistor T1 is connected to an anode of the light emitting diode LED via the sixth transistor T6. The first transistor T1 may receive a data signal Dm transferred by the data line 171 depending on a switching operation of the second transistor T2 to supply a driving current Id to the light emitting diode LED.

The gate electrode G2 of the second transistor T2 is connected to the first scan line 151, a first electrode S2 of the second transistor T2 is connected to the data line 171, and a second electrode D2 of the second transistor T2 is connected to the first electrode S1 of the first transistor T1 and to the driving voltage line 172 via the fifth transistor T5. The second transistor T2 may be turned on depending on the scan signal GWn received through the first scan line 151 to transfer the data signal Dm transferred from the data line 171 to the first electrode Ea1 of the first transistor T1.

A gate electrode G3 of the third transistor T3 is connected to the first scan line 151, and a first electrode Ea3 of the third transistor T3 is connected to the second electrode Eb1 of the first transistor T1 and to the anode of the light emitting diode LED via the sixth transistor T6. A second electrode Eb3 of the third transistor T3 is connected to a second electrode Eb4 of the fourth transistor T4, the first end of the capacitor Cst, and the gate electrode G1 of the first transistor T1. The third transistor T3 may be turned on depending on the scan signal GWn transferred through the first scan line 151 to connect the gate electrode G1 and the second electrode Eb1 of the first transistor T1 to each other such that the first transistor T1 can be diode-connected.

The gate electrode G4 of the fourth transistor T4 is connected to the second scan line 152, a first electrode Ea4 of the fourth transistor T4 is connected to a terminal of an initialization voltage Vint, and a second electrode Eb4 of the fourth transistor T4 is connected to a first end of the capacitor Cst via the second electrode Eb3 of the third transistor T3 and to the gate electrode G1 of first transistor T1. The fourth transistor T4 is turned on by the scan signal GIn transferred through the second scan line 152 to transfer the initialization voltage Vint to the gate electrode G1 of the first transistor T1, in order to perform an initializing operation for initializing a voltage of the gate electrode G1 of the transistor T1.

The gate electrode G5 of the fifth transistor T5 is connected to the emission control line 155, a first electrode Ea5 of the fifth transistor T5 is connected to the driving voltage line 172, and a second electrode Eb5 of the fifth transistor T5 is connected to the first electrode Ea1 of the first transistor T1 and to the second electrode Eb2 of the second transistor T2.

A gate electrode G6 of the sixth transistor T6 is connected to the emission control line 155, and a first electrode Ea6 of the sixth transistor T6 is connected to the first electrode Eb1 of the first transistor T1 and the first electrode Ea3 of the third transistor T3. A second electrode Eb6 of the sixth transistor T6 is electrically connected to the anode of the light emitting diode LED. The fifth transistor T5 and the sixth transistor T6 are simultaneously turned on depending on the emission control signal EM transferred through the emission control line 155, thereby the driving voltage ELVDD is compensated through the diode-connected first transistor T1 to be transmitted to the light emitting diode LED.

A gate electrode G7 of the seventh transistor T7 is connected to the third scan line 154, and a first electrode Ea7 of the seventh transistor T7 is connected to the second electrode Eb6 of the sixth transistor T6 and the anode of the light emitting diode LED. A second electrode Eb7 of the seventh transistor T7 is connected to the terminal of the initialization voltage Vint terminal and the first electrode Ea4 of the fourth transistor T4.

The transistors T1, T2, T3, T4, T5, T6, and T7 may be P-type channel transistors such as PMOS transistors, but the present invention is not limited thereto, and at least one of the transistors T1, T2, T3, T4, T5, T6, and T7 may be an N-type channel transistor, or may include both a P-type channel transistor and an N-type channel transistor.

A first end of the capacitor Cst is connected to the gate electrode G1 of the first transistor T1 as described above, and a second end is connected to the driving voltage line 172. A cathode of the light emitting diode LED may be connected to the terminal of the common voltage ELVSS for transferring the common voltage ELVSS to receive the common voltage ELVSS.

The structure of a pixel PX according to an embodiment is not limited to the structure illustrated in FIG. 2, and numbers of the transistors and capacitors included in one pixel PX and a connection relationship thereof may be variously modified.

Figure 3A:
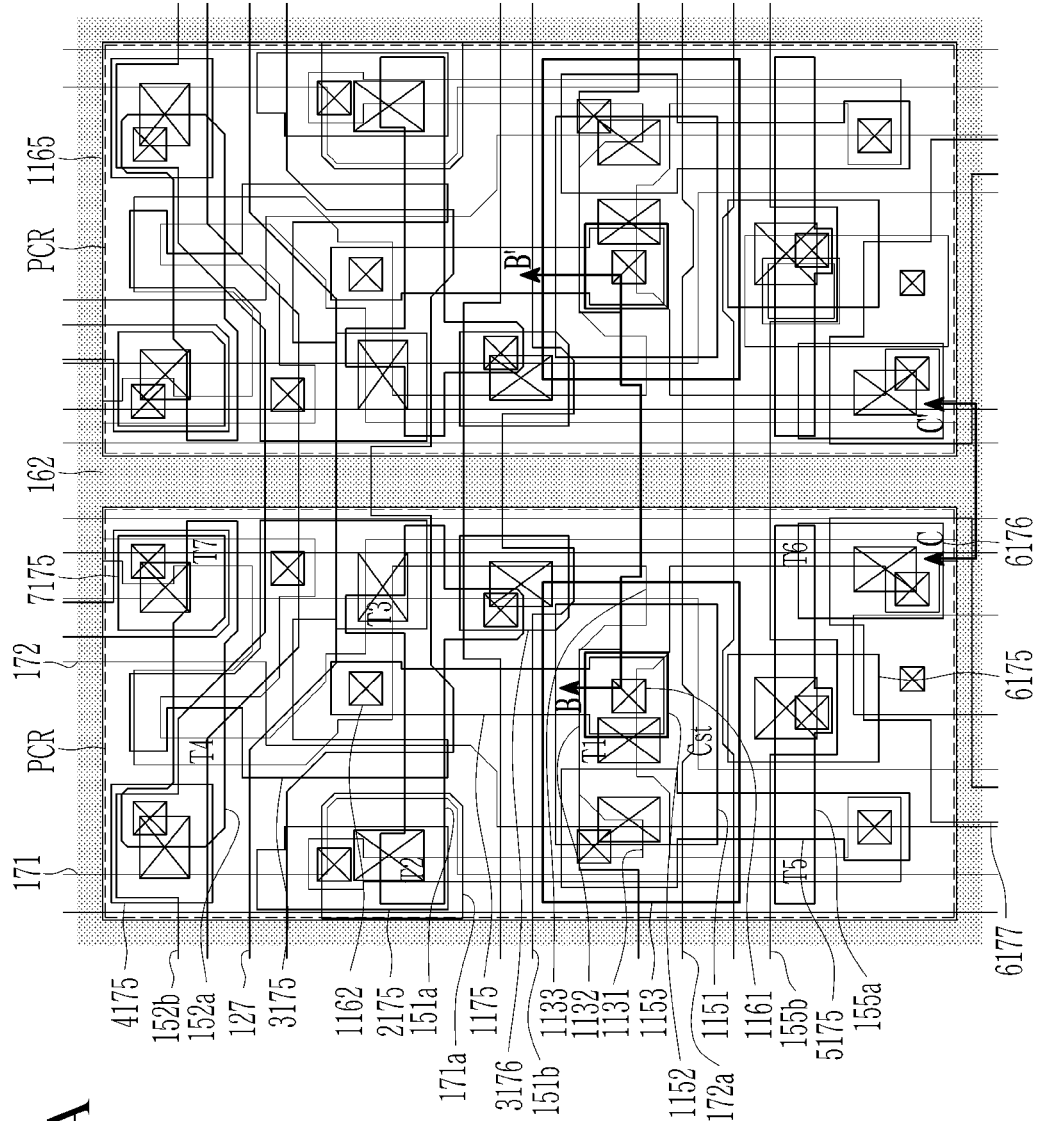
FIG. 3A partially illustrates a top plan view of a display device according to an embodiment.
Figure 3B:
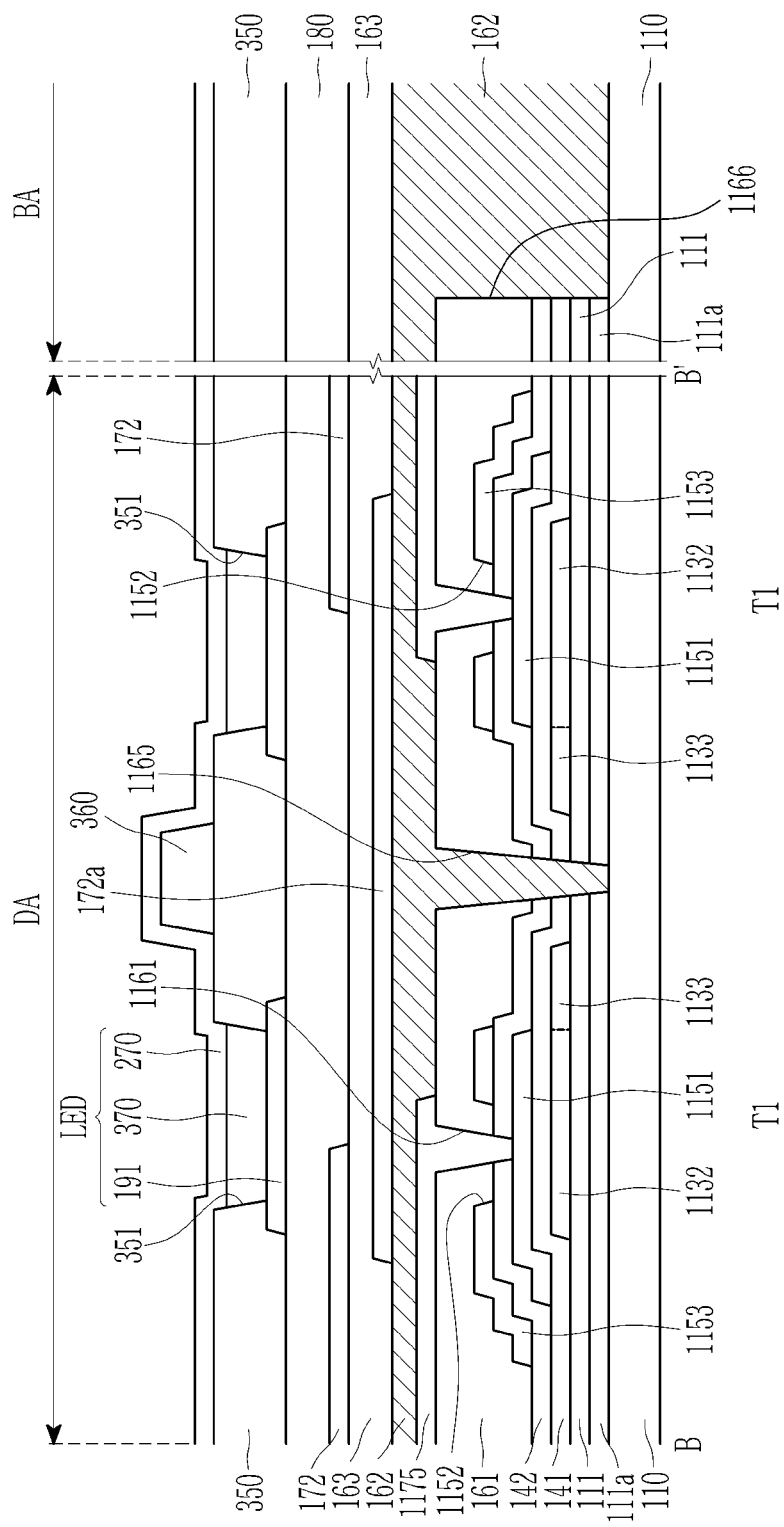
FIG. 3B and FIG. 3C each illustrate a cross-sectional view showing a portion of the display device of FIG. 3A according to an embodiment.
Figure 3C:
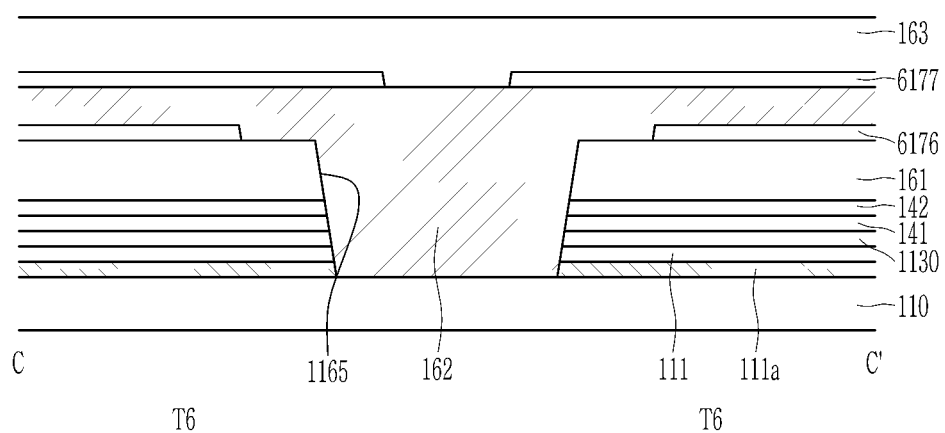

Hereinafter, a structure of one pixel of the display device according to an embodiment will be further described with reference to FIG. 3A to FIG. 9B. FIG. 3A partially illustrates a top plan view of a display device according to an embodiment, and FIG. 3B and FIG. 3C each illustrate a cross-sectional view showing a portion of the display device of FIG. 3A according to an embodiment. FIG. 3B illustrates a portion of a display area along a line B-B' of FIG. 3A, and illustrates a portion of a bending area. FIG. 3C illustrates a portion of the display area along a line C-C' of FIG. 3A. FIG. 4A, FIG. 5A, FIG. 6A, FIG. 7A, FIG. 8A, and FIG. 9A each illustrate a plan view sequentially showing some configurations in the top plan view of FIG. 3A according to an embodiment. FIG. 4B, FIG. 5B, FIG. 6B, FIG. 7B, FIG. 8B, and FIG. 9B each illustrate a cross-sectional view sequentially showing some configurations in the top plan view of FIG. 3B according to an embodiment. FIG. 3A to FIG. 9B illustrate two adjacent pixels, and the two adjacent pixels may have planar structures that are symmetrical to each other. However, the present invention is not limited thereto, and the two adjacent pixels may have a same planar structure.

Figure 4A:
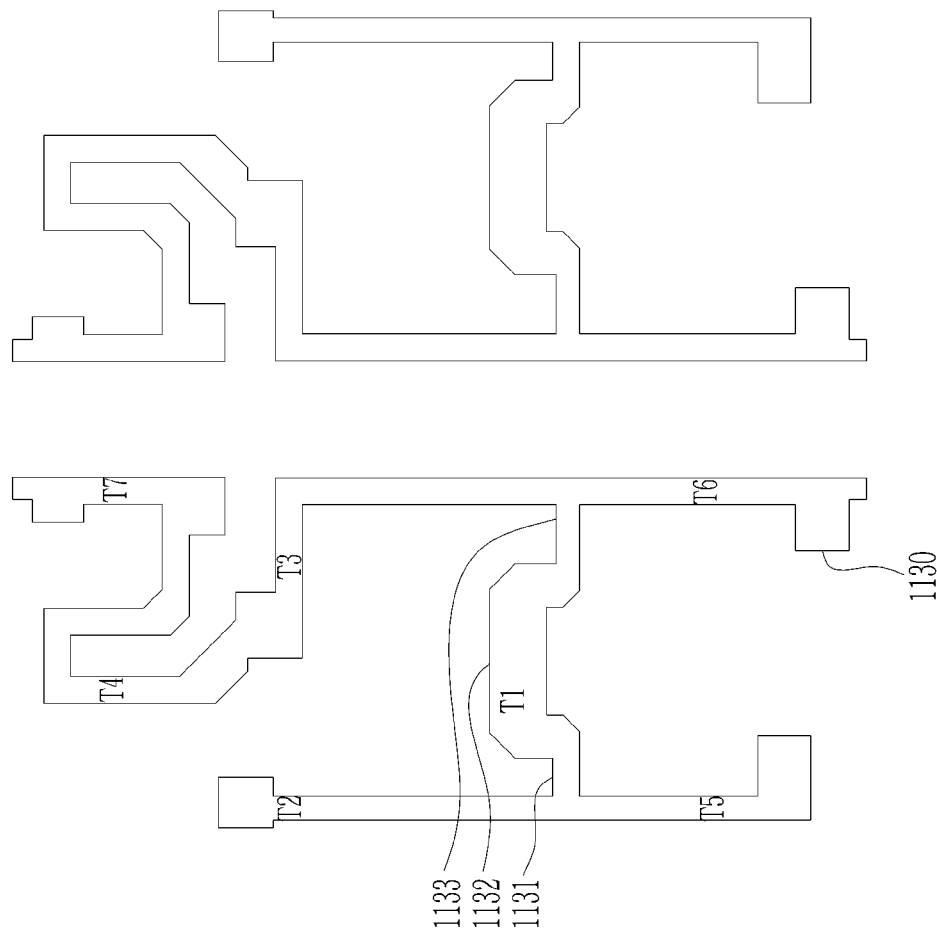
FIG. 4A, FIG. 5A, FIG. 6A, FIG. 7A, FIG. 8A, and FIG. 9A illustrate top plan views showing some constituent elements of a display device according to an embodiment.
Figure 4B:
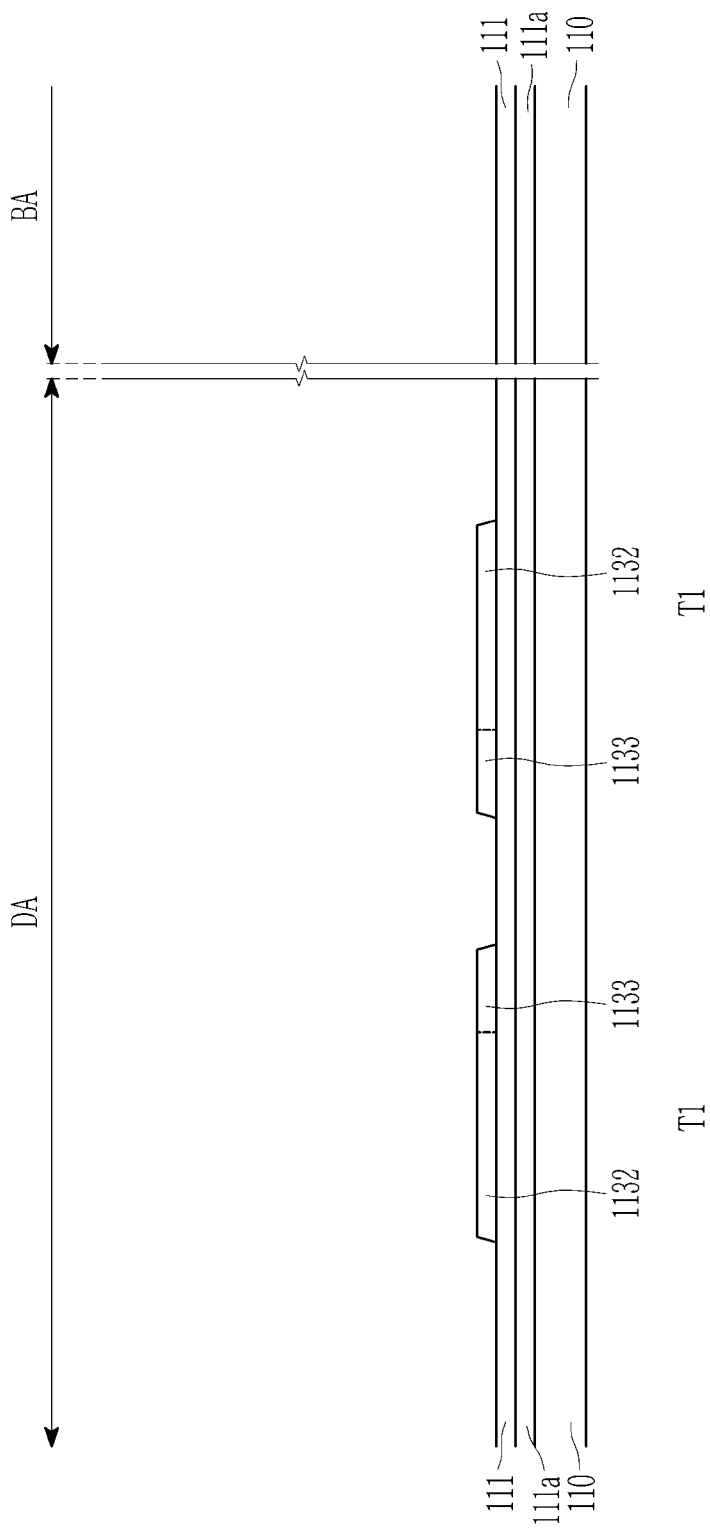
FIG. 4B, FIG. 5B, FIG. 6B, FIG. 7B, FIG. 8B, and FIG. 9B illustrate cross-sectional views showing some constituent elements of a display device according to an embodiment.

FIG. 4A and FIG. 4B show a semiconductor layer 1130 including a channel 1132, a first region 1131, and a second region 1133 of the first transistor T1, which may be positioned on the substrate 110. The semiconductor layer 130 may further include a channel, a first region, and a second region of each of the second transistor T2, the third transistor T3, the fourth transistor T4, the fifth transistor T5, the six transistor T6, and the seventh transistor T7 as well as the first transistor.

The channel 1132 of the first transistor T1 may have a bent shape in a plan view. However, the shape of the channel 1132 of the first transistor T1 is not limited thereto, and may be variously changed. For example, the channel 1132 of the first transistor T1 may be bent in different shapes, or may be formed in a bar-like shape. The first region 1131 and the second region 1133 of the first transistor T1 may be positioned at opposite sides of the channel 1132 of the first transistor T1. The first region 1131 of the first transistor T1 extends upward and downward in a plan view, a portion extending downward may be connected to the second region of the fifth transistor T5, and a portion extending upward may be connected to the second region of the second transistor T2. The second region 1133 of the first transistor T1 extends upward and downward in a plan view, a portion extending downward may be connected to the first region of the sixth transistor T6, and a portion extending upward may be connected to the first region of the third transistor T3.

The buffer layer 111 may be disposed between the substrate 110 and the semiconductor layer 1130 including the channel 1132, the first region 1131, and the second region 1133 of the first transistor T1. The buffer layer 111 may have a single or multi-layered structure The buffer layer 111 may include an inorganic insulating material or organic insulating material such as a silicon nitride ($SiN_x$), a silicon oxide ($SiO_x$), and a silicon oxynitride ($SiO_xN_y$). In addition, a barrier layer 111a may be further disposed between the substrate 110 and the buffer layer 111. The barrier layer 111a may have a single or multi-layered structure The barrier layer 111a may include an inorganic insulating material such as a silicon nitride ($SiN_x$), a silicon oxide ($SiO_x$), and a silicon oxynitride ($SiO_xN_y$).

Figure 5A:
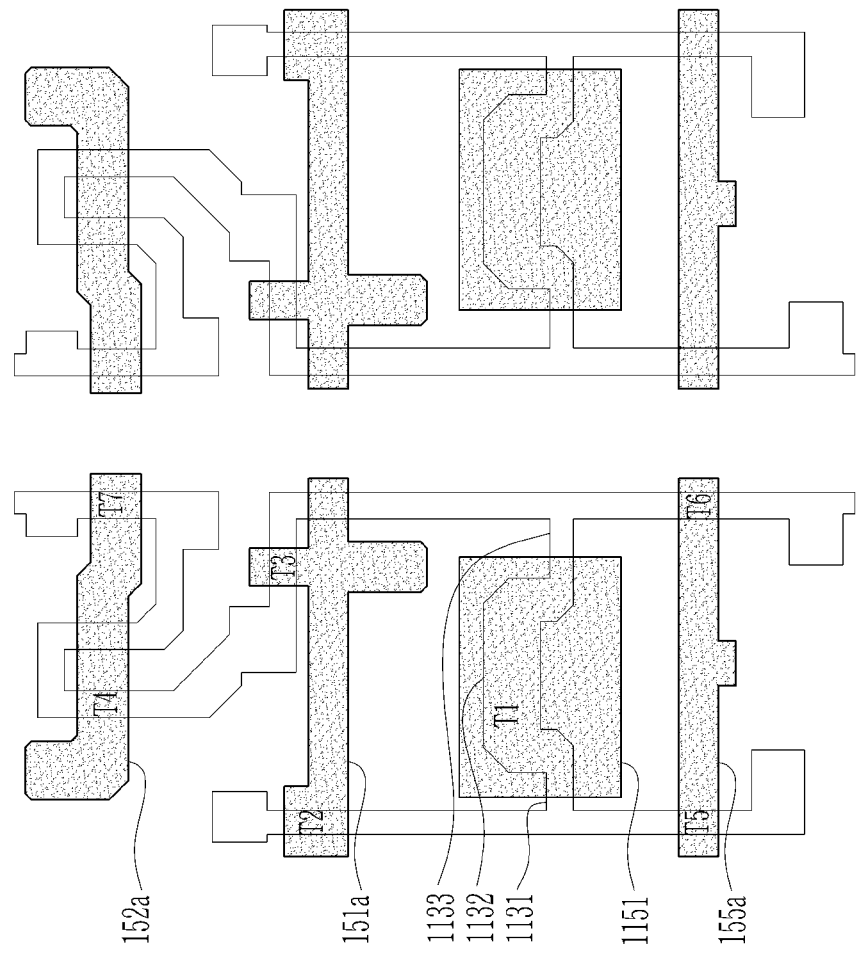
Figure 5B:
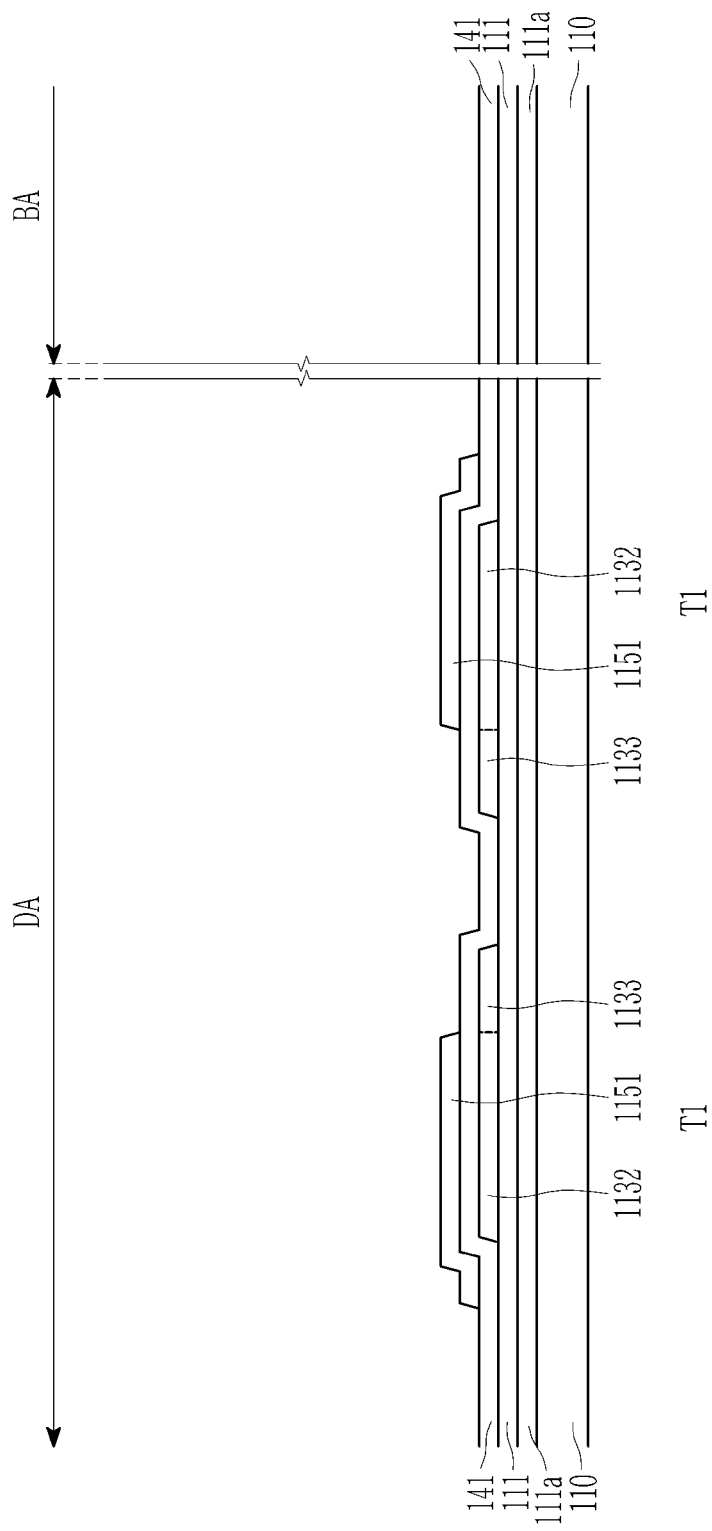

FIG. 5A and FIG. 5B show a first gate insulating layer 141 and a first gate conductor that includes a gate electrode 1151 of the first transistor T1. The first gate insulating layer 141 may be disposed on the semiconductor layer 1130 including the channel 1132, the first region 1131, and the second region 1133 of the first transistor T1. The first gate insulating layer 141 may have a single or multi-layered structure. The first gate insulating layer 141 may include an inorganic insulating material such as a silicon nitride ($SiN_x$), a silicon oxide ($SiO_x$), and a silicon oxynitride ($SiO_xN_y$). The first gate conductor including the gate electrode 1151 of the first transistor T1 may be positioned on the first gate insulating layer 141.

The first gate conductor may have a single or multi-layered structure. The first gate conductor may include a metal material such as molybdenum (Mo), aluminum (Al), copper (Cu), or titanium (Ti). The first gate conductor may further include a gate electrode of each of the second transistor T2, the third transistor T3, the fourth transistor T4, the fifth transistor T5, the transistor T6, and the seventh transistor T7 as well as the first transistor T1.

The gate electrode 1151 of the driving transistor T1 may overlap the channel 1132 of the driving transistor T1. The channel 1132 of the first transistor T1 may overlap the electrode channel 1151 of the driving transistor T1.

The first gate conductor may further include a first lower scan line 151a, a second lower scan line 152a, and a lower emission control line 155a. The first lower scan line 151a, the second lower scan line 152a, and the lower emission control line 155a may extend substantially in a row direction. The first lower scan line 151a, the second lower scan line 152a, and the lower emission control line 155a may be independently positioned in two adjacent pixels. That is, the first lower scan line 151a positioned in a left pixel may be positioned apart from the first lower scan line 151a positioned in a right pixel. In addition, the second lower scan line 152a positioned in the left pixel may be positioned apart from the second lower scan line 152a positioned in the right pixel. In addition, the lower emission control line 155a positioned in the left pixel may be positioned apart from the lower emission control line 155a positioned in the right pixel. The first lower scan line 151a may be connected to the gate electrode of the second transistor T2 and the gate electrode of the third transistor T3. The first lower scan line 151a may be integrally formed with the gate electrode of the second transistor T2 and the gate electrode of the third transistor T3. The second lower scan line 152a may be connected to the gate electrode of the fourth transistor T4. The second lower scan line 152a may be integrally formed with the gate electrode of the fourth transistor T4. The second lower scan line 152a may be connected to the gate electrode of the seventh transistor T7 positioned in a pixel of a previous stage. That is, the bypass control line connected to the seventh transistor T7 may be formed as the second lower scan line 152a of a next stage. The lower emission control line 155a may be connected to the gate electrode of the fifth transistor T5 and the gate electrode of the sixth transistor T6. The lower emission control line 155a may be integrally formed with the gate electrode of the fifth transistor T5 and the gate electrode of the sixth transistor T6.

After the first gate conductor including the gate electrode 1151 of the first transistor T1 is formed, a doping process or plasma treatment may be performed. A portion of the semiconductor layer covered by the first gate conductor is not subjected to doping or plasma treatment, and a portion of the semiconductor layer which is not covered by the first gate conductor may be doped or treated with plasma to have the same characteristic as that of the conductor. Accordingly, the first and second regions of the first to seventh transistors T1, T2, T3, T4, T5, T6, and T7 of the semiconductor layer may serve as a first electrode and a second electrode, respectively. In this case, the doping process can be performed with a P-type dopant, and the first transistor T1, the second transistor T2, the third transistor T3, the fourth transistor T4, the fifth transistor T5, the sixth transistor T6, and the seventh transistor T7 may have a P-type transistor characteristic.

Figure 6A:
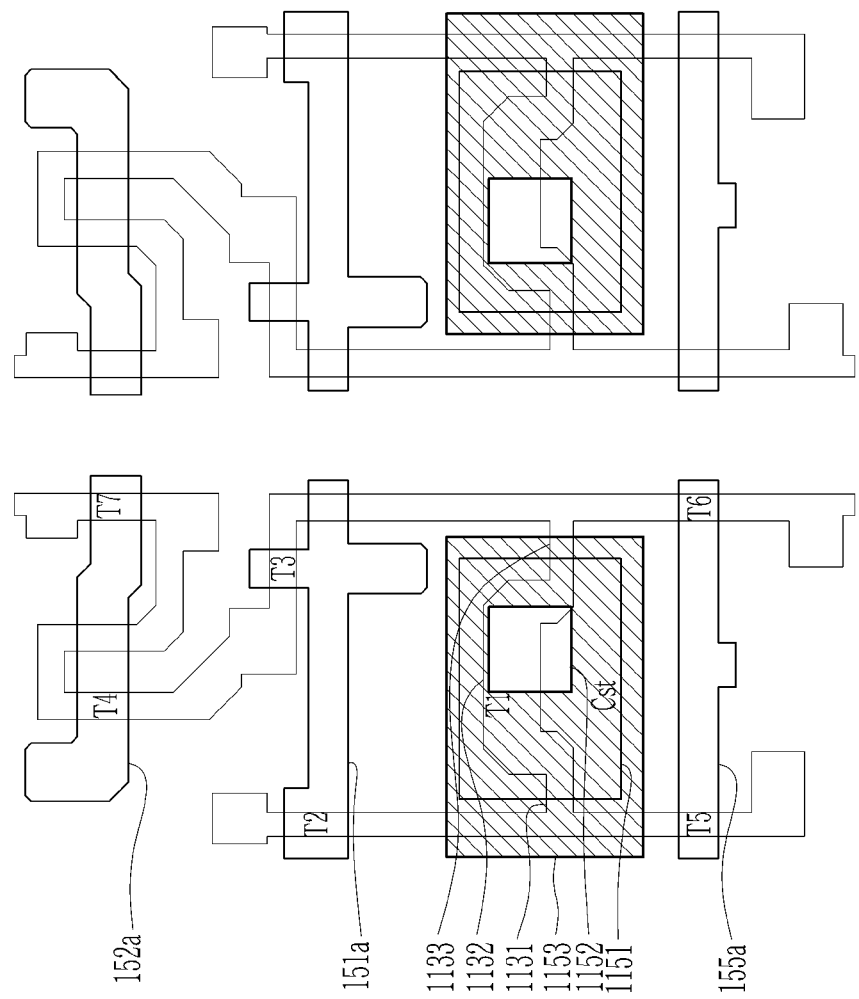
Figure 6B:
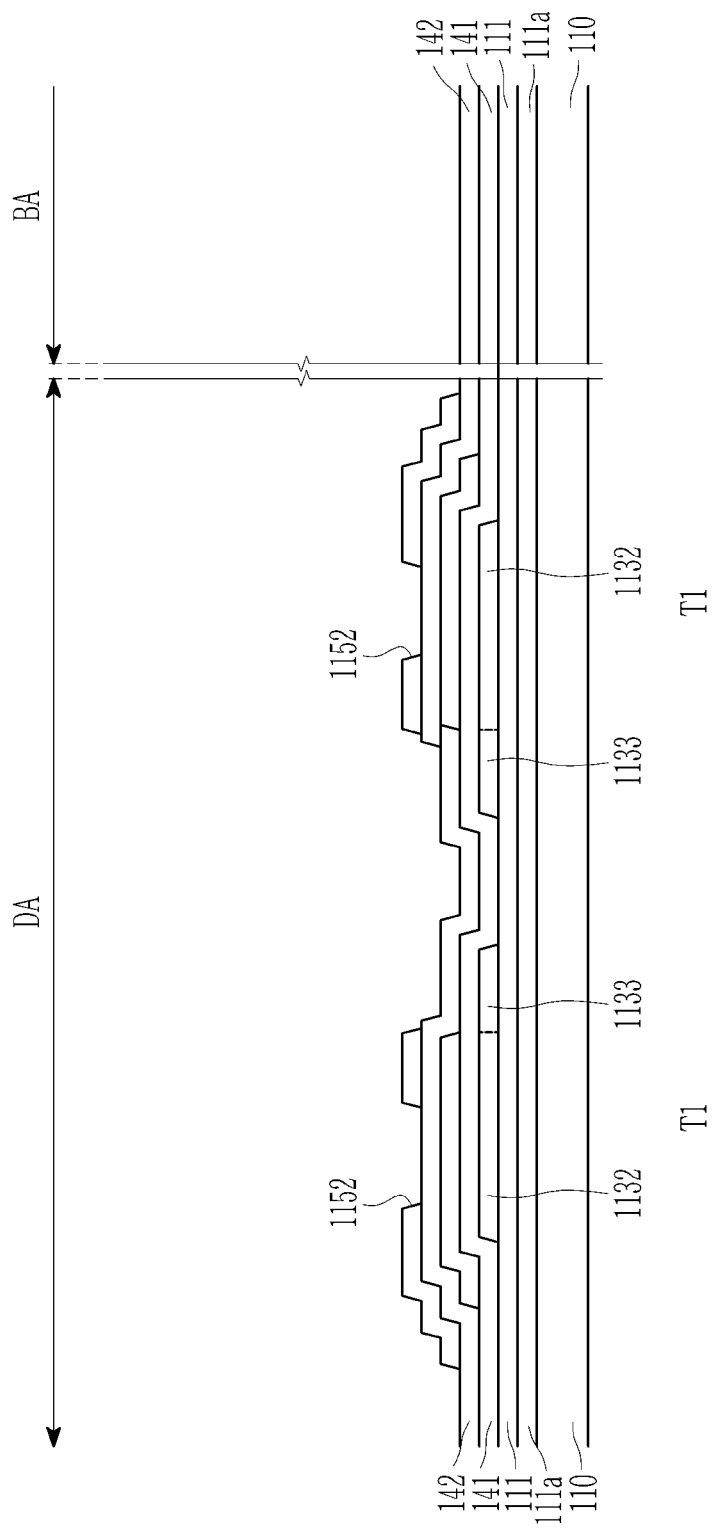

FIG. 6A and FIG. 6b show a second gate insulating layer 142, the first gate conductor, and a second gate conductor. The second gate insulating layer 142 may be disposed on the first gate insulating layer 141 and the first gate conductor including the gate electrode 1151 of the first transistor T1. The second gate insulating layer 142 may have a single or multi-layered structure. The second gate insulating layer 142 may include an inorganic insulating material such as a silicon nitride ($SiN_x$), a silicon oxide ($SiO_x$), and a silicon oxynitride ($SiO_xN_y$). The second gate conductor including a first storage electrode 1153 of the storage capacitor Cst may be positioned on the second gate insulating layer 142. The second gate conductor may have a single or multi-layered structure. The second gate conductor may include a metal material such as molybdenum (Mo), aluminum (Al), copper (Cu), or titanium (Ti).

The first storage electrode 1153 overlaps the gate electrode 1151 of the first transistor T1 to constitute the storage capacitor Cst. An opening 1152 is formed in the first storage electrode 1153 of the storage capacitor Cst. The opening 1152 of the first storage electrode 1153 of the storage capacitor Cst may overlap the gate electrode 1151 of the first transistor T1.

A first interlayer insulating layer 161 (FIG. 7B) may be disposed on the second gate conductor including the first storage electrode 1153 of the storage capacitor Cst. The first interlayer insulating layer 161 may have a single or multi-layered structure. The first interlayer insulating layer 161 may include an inorganic insulating material such as a silicon nitride ($SiN_x$), a silicon oxide ($SiO_x$), and a silicon oxynitride ($SiO_xN_y$).

Figure 7A:
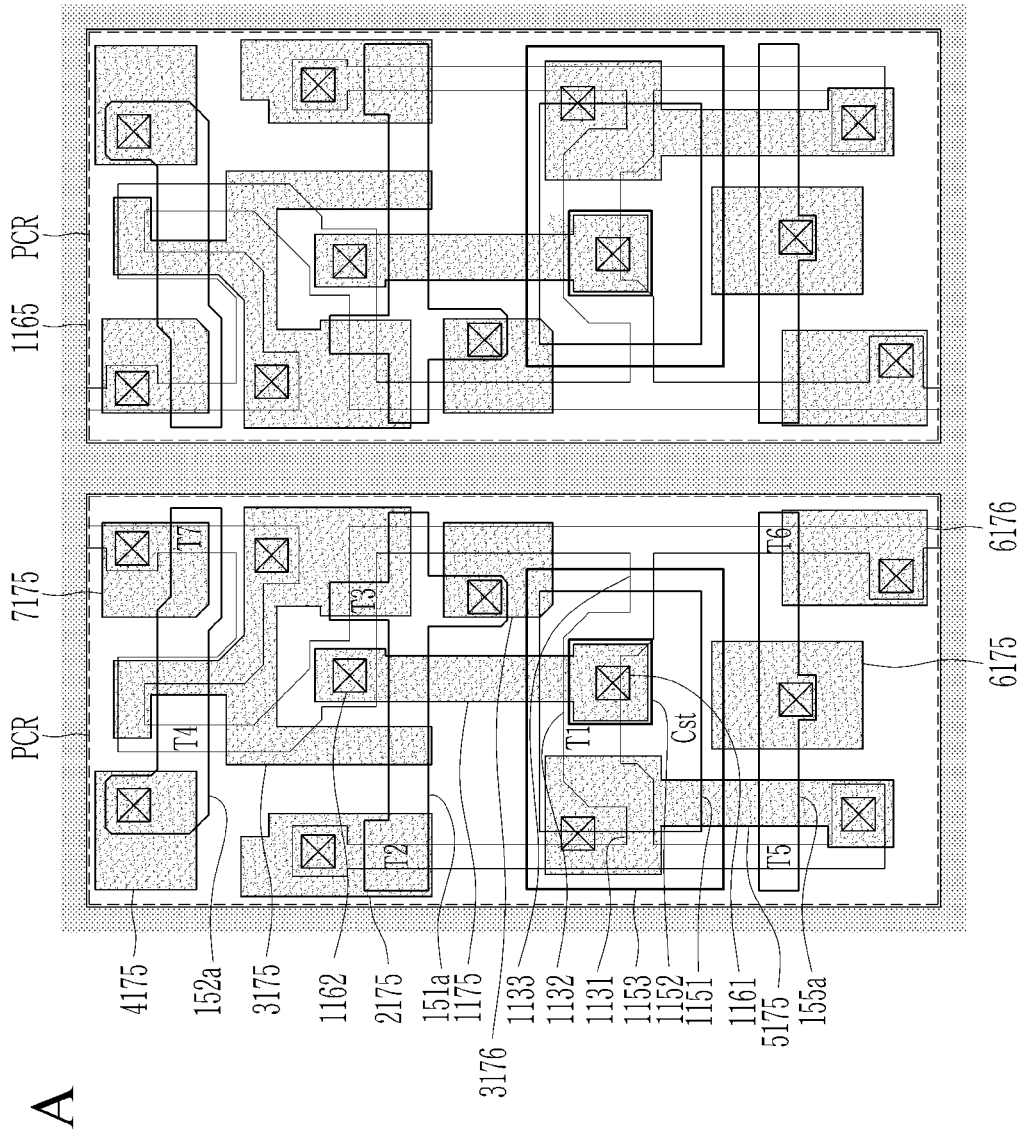
Figure 7B:
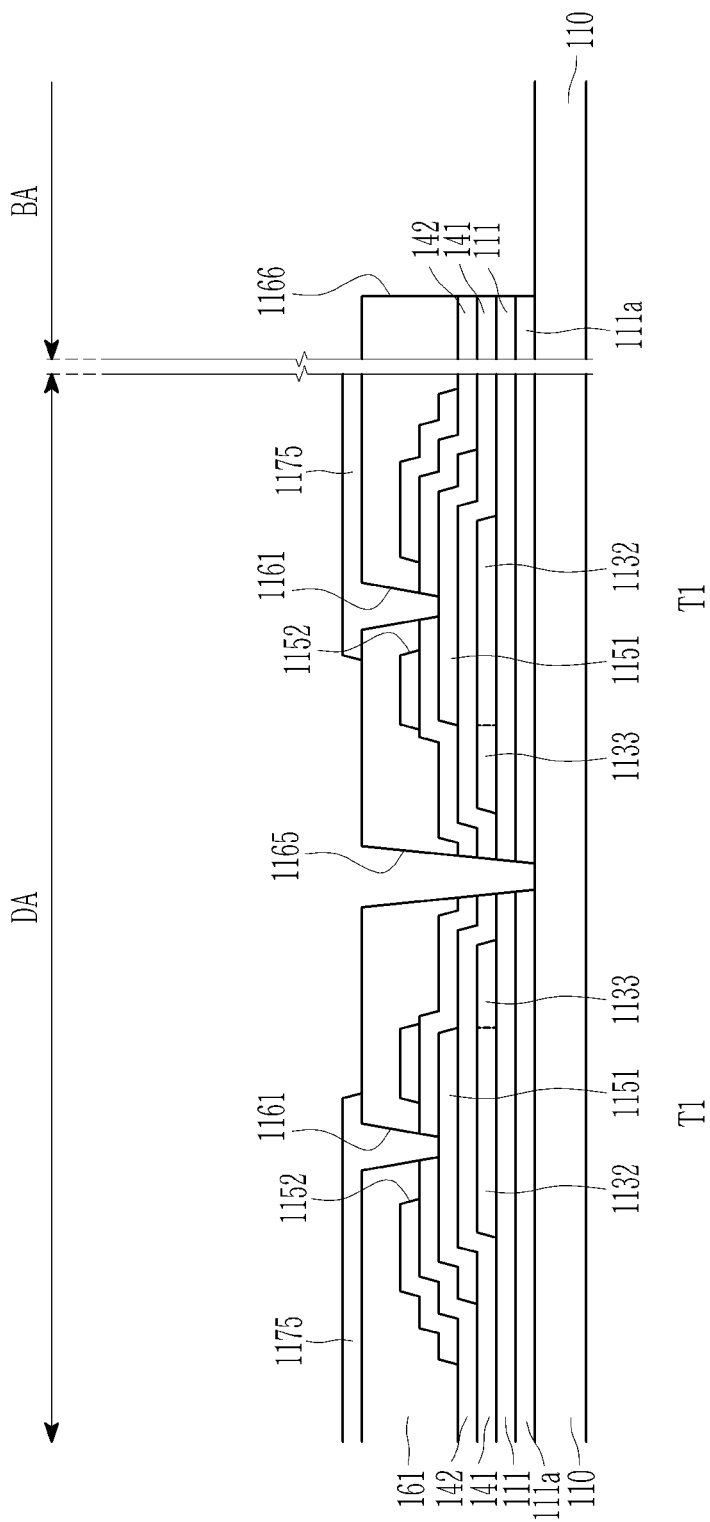

A third gate conductor including the first connection electrode 1175 may be positioned on the first interlayer insulating layer 161. FIG. 7A and FIG. 7B illustrate the semiconductor layer, the first gate conductor, the second gate conductor, and the third gate conductor together. The third gate conductor may have a single or multi-layered structure. The third gate conductor may include a metal material such as molybdenum (Mo), aluminum (Al), copper (Cu), or titanium (Ti).

The first connection electrode 1175 may connect the first transistor T1, the third transistor T3, and the fourth transistor T4. An end of a first side of the first connection electrode 1175 may overlap the gate electrode 1151 of the first transistor T1. The first interlayer insulating layer 161 may include an opening 1161 overlapping the first connection electrode 1175 and the gate electrode 1151 of the first transistor T1. The first connection electrode 1175 may be connected to the gate electrode 1151 of the first transistor T1 through the opening 1161 and the opening 1152 of the first storage electrode 1153. An end of a second side of the first connection electrode 1175 may overlap the second region of the third transistor T3 and the second region of the fourth transistor T4. The first interlayer insulating layer 161 may include an opening 1162 overlapping the first connection electrode 1175, the second region of the third transistor T3, and the second region of the fourth transistor T4. The first connection electrode 1175 may be connected to the second region of the third transistor T3 and the second region of the fourth transistor T4 through the opening 1162. Accordingly, the gate electrode 1151 of the first transistor T1 may be connected to the second region of the third transistor T3 and the second region of the fourth transistor T4 by the first connection electrode 1175.

The third gate conductor may further include a second connection electrode 2175, a third connection electrode 3175, a fourth connection electrode 3176, a fifth connection electrode 4175, a sixth connection electrode 5175, a seventh connection electrode 6175, an eighth connection electrode 6176, and a ninth connection electrode 7175.

The second connection electrode 2175 may overlap the second transistor T2, and may be connected to the first region of the second transistor T2. The third connection electrode 3175 may overlap the third transistor T3, the fourth transistor T4, and the seventh transistor T7, and may be connected to the first region of the fourth transistor T4 and the second region of the seventh transistor T7. The fourth connection electrode 3176 may overlap and may be connected to the first lower scan line 151*a*. The fifth connection electrode 4175 may overlap and may be connected to the second lower scan line 152*a*. The sixth connection electrode 5175 may overlap the first storage electrode 1153 and the fifth transistor T5, and may be connected to the first storage electrode 1153 and the first region of the fifth transistor T5. The seventh connection electrode 6175 may overlap and may be connected to the lower emission control line 155*a*. The eighth connection electrode 6176 may overlap the sixth transistor T6 and may be connected to the second region of the sixth transistor T6. The ninth connection electrode 7175 may overlap the seventh transistor T7, and may be connected to the first region of the seventh transistor T7.

In one pixel, the first to the seventh transistors T1, T2, T3, T4, T5, T6, and T7, the storage capacitor Cst, the first lower scan line 151*a*, the second lower scan line 152*a*, the lower emission control line 155*a*, the first connection electrode 1175, the second connection electrode 2175, the third connection electrode 3175, the fourth connection electrode 3176, the fifth connection electrode 4175, the sixth connection electrode 5175, the seventh connection electrode 6175, the eighth connection electrode 6176, and the ninth connection electrode 7175 may be positioned within a pixel circuit region PCR. The pixel circuit region PCR may be formed to have an approximately quadrangular shape However, the shape of the pixel circuit region PCR is not limited thereto, and may be variously changed. Pixel circuit regions PCR of two adjacent pixels are distinguished from each other and do not overlap. That is, the pixel circuit region PCR of a left pixel and the pixel circuit region PCR of a right pixel do not overlap each other.

The first interlayer insulating layer 161 may include an opening 1165, and a plurality of pixel circuit regions PCR may be divided by the opening 1165. That is, the opening 1165 may be positioned between the plurality of pixel circuit regions PCR, and may be formed to surround an edge of the pixel circuit region PCR. The opening 1165 may be formed not only in the first interlayer insulating layer 161, but also in the first gate insulating layer 141 and the second gate insulating layer 142. In addition, the opening 1165 according to an embodiment may be formed in the buffer layer 111 positioned below the semiconductor layer. The opening 1165 according to an embodiment may also be formed in the barrier layer 111*a*. The opening 1165 may extend through the first interlayer insulating layer 161, the second gate insulating layer 142, the first gate insulating layer 141, the buffer layer 111, and the barrier layer 111*a*. The opening 1165 may have a cross-section width that decreases toward the substrate 110. That is, an area occupied by the opening 1165 may decrease toward the substrate 110.

Semiconductor layers, first gate conductors, second gate conductors, and third gate conductors positioned in different pixel circuit regions PCR are not directly connected to each other, but are spaced apart from each other. In this case, as shown in FIG. 7A, at least a portion of the semiconductor layer 1130 positioned in one pixel circuit region PCR may extend to the opening 1165 dividing the pixel circuit region PCR. The semiconductor layer 1130 may contact the opening 1165.

A second interlayer insulating layer 162 (FIG. 8A and FIG. 8B) may be disposed on the third gate conductor including the first connection electrode 1175. The second interlayer insulating layer 162 may have a single or multi-layered structure. The second interlayer insulating layer 162 may include a general purpose polymer such as poly(methyl methacrylate) (PMMA) or polystyrene (PS), a polymer derivative having a phenolic group, an organic insulating material such as an acrylic polymer, an imide polymer, a polyimide, an acrylic polymer, a siloxane polymer, etc.

The second interlayer insulating layer 162 may be formed to fill the opening 1165. The pixel circuit regions PCR may be divided by the second interlayer insulating layer 162. That is, the second interlayer insulating layer 162 may be positioned between the plurality of pixel circuit regions PCR, and may be formed to surround an edge of the pixel circuit region PCR. Each pixel may be formed to have an island shape by forming the opening 1165 in the second gate insulating layer 142, the first gate insulating layer 141, and the first interlayer insulating layer 161 made of an inorganic material and positioning the second interlayer insulating layer 162 made of an organic material within the opening 1165. Accordingly, even when an impact is applied from the outside and damage to the first interlayer insulating layer 161, etc. occurs, the pixel circuit region PCR has an independent structure by the second interlayer insulating layer 162 made of an organic material, and thus it is possible to prevent affecting other adjacent pixels. That is, it is possible to prevent cracks generated in any one region from propagating in the horizontal direction.

The second interlayer insulating layer 162 filling the opening 1165 may directly contact a portion of the semiconductor layer 1130 extending to the opening 1165. During a manufacturing process, semiconductor layers 1130 positioned in different pixel circuit regions PCR may be integrally formed. However, a portion of the semiconductor layer 1130 may be removed in a process of forming the opening 1165 penetrating the first interlayer insulating layer 161, the second gate insulating layer 142, the first gate insulating layer 141, the buffer layer 111, and the barrier layer 110b. Then, the opening 1165 may be filled with the second interlayer insulating layer 162. Accordingly, the semiconductor layer 1130 may be independently positioned in one pixel circuit region PCR and the semiconductor layer 1130 positioned in the adjacent pixel circuit region PCR may be spaced apart from each other by the opening 1165. In addition, since semiconductor layers positioned in a plurality of pixel circuit regions PCR are connected to each other during the manufacturing process, it is possible to prevent static electricity from occurring.

The first interlayer insulating layer 161 may further include the opening 1166 in the bending area BA. The opening 1166 may be formed not only in the first interlayer insulating layer 161, but also in the first gate insulating layer 141 and the second gate insulating layer 142. The second interlayer insulating layer 162 may be formed to fill the opening 1166. The bending area BA may have a structure that is advantageous for bending by removing the second gate insulating layer 142, the first gate insulating layer 141, and the first interlayer insulating layer 161 made of an inorganic material, which are positioned in the bending area BA as an area where the substrate 110 is bendable, and forming the second interlayer insulating layer made of an organic material instead thereof.

Figure 8A:
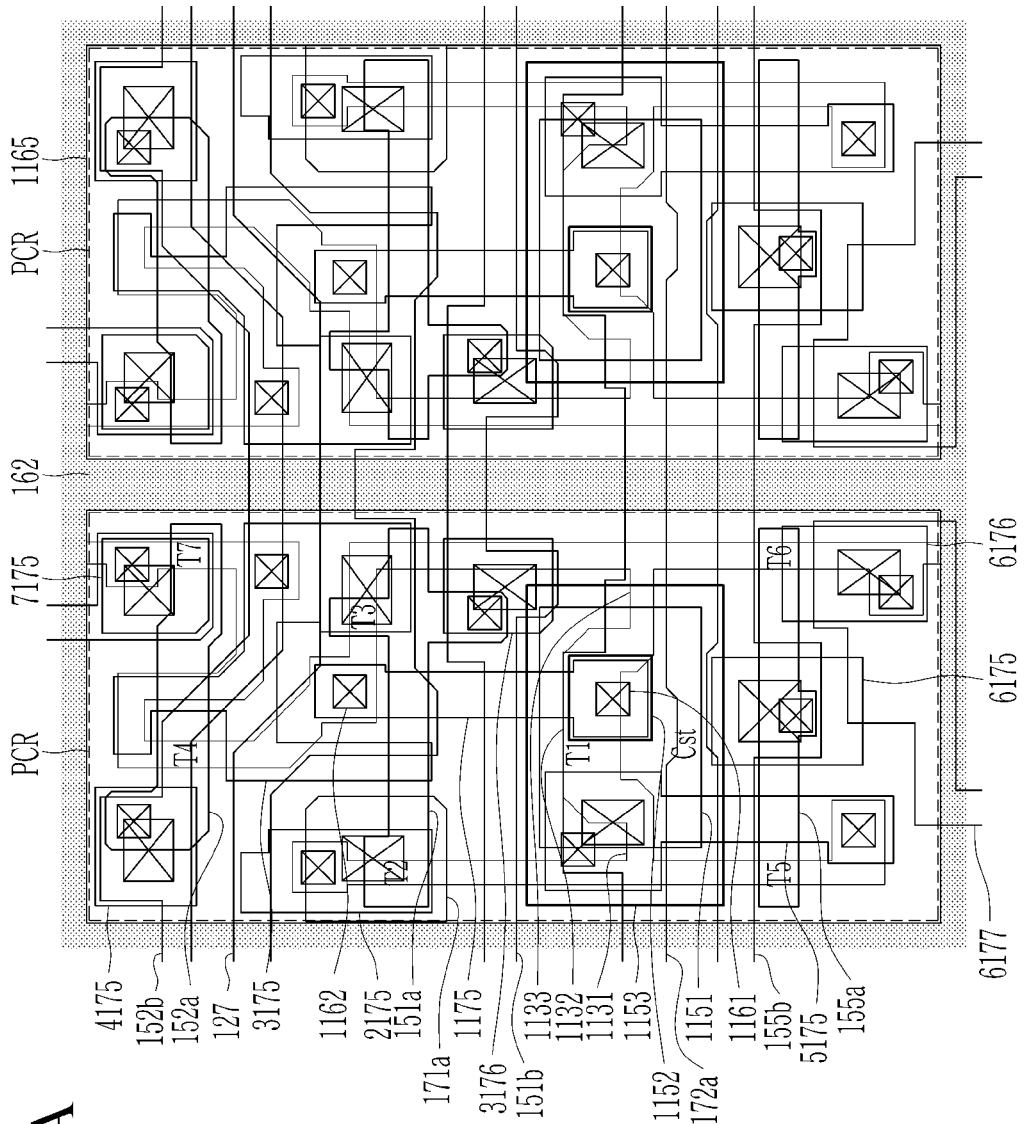
Figure 8B:
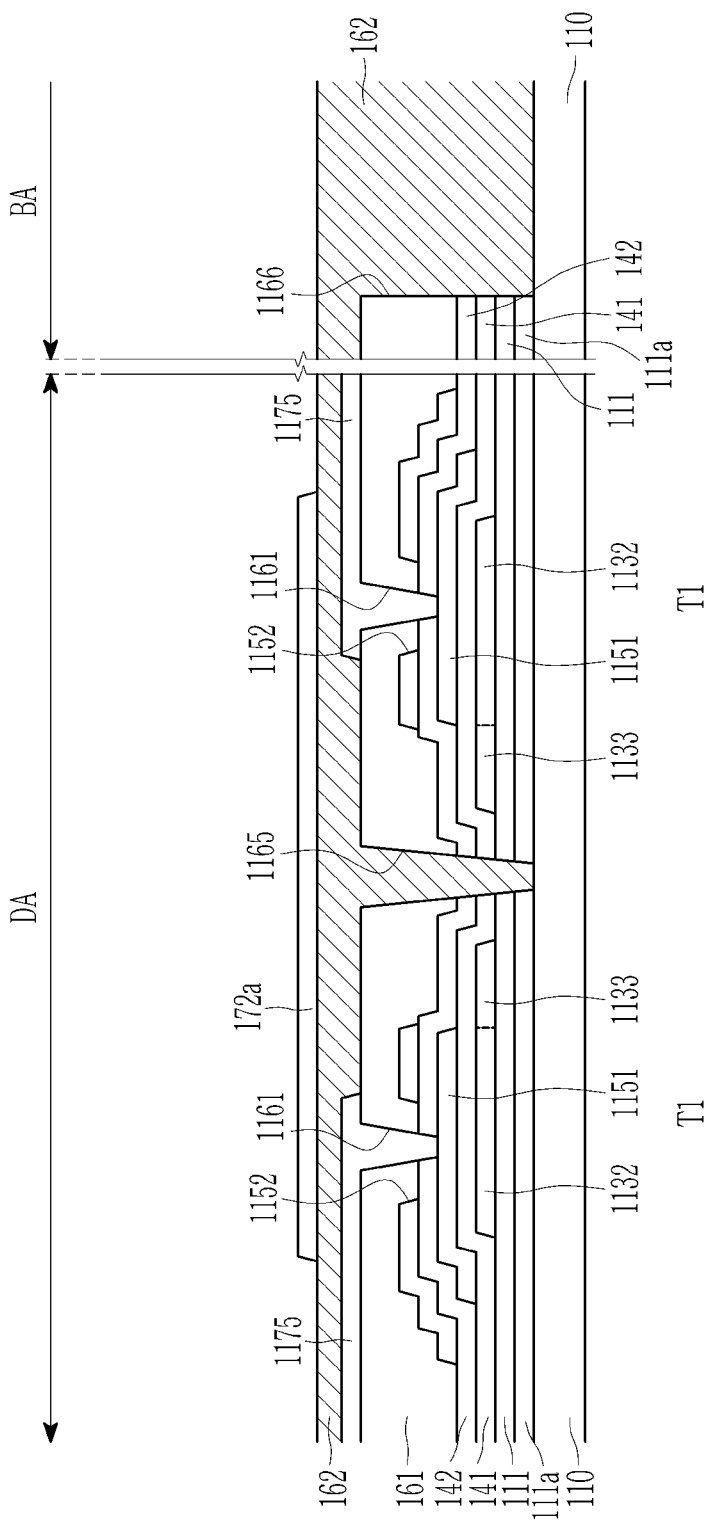

A first data conductor including an first upper scan line 151b, an upper second scan line 152b, an upper emission control line 155b, and an initialization voltage line 127 may be positioned on the second interlayer insulating layer 162. FIG. 8A and FIG. 8B illustrate the semiconductor layer 1130, the first gate conductor, the second gate conductor, the third gate conductor, and the first data conductor together. The first data conductor may have a single or multi-layered structure. The first data conductor may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), or copper (Cu), and the like, and may be a single layer or multiple layers.

The first upper scan line 151b may overlap at least a portion of the first lower scan line 151a, and may be connected to the first lower scan line 151a. The first upper scan line 151b and the first lower scan line 151a may be connected by the fourth connection electrode 3176. The first upper scan line 151b constitutes the first scan line 151 together with the first lower scan line 151a. The first upper scan line 151b may extend substantially in a row direction, and may extend from a first end of the substrate 110 to a second end of the substrate 110. The first lower scan line 151a of pixels that are adjacent in the row direction may be connected to the same first upper scan line 151b. The scan signal GW applied to the first upper scan line 151b may be applied to the gate electrode of the second transistor T2 and the gate electrode of the third transistor T3 through the first lower scan line 151a.

The upper second scan line 152b may overlap at least a portion of the second lower scan line 152a, and may be connected to the second lower scan line 152a. The upper second scan line 152b and the second lower scan line 152a may be connected by the fifth connection electrode 4175. The upper second scan line 152b constitutes the second scan line 152 together with the second lower scan line 152a. The upper second scan line 152b may extend substantially in the row direction, and may extend from a first end of the substrate 110 to a second end of the substrate 110. The second lower scan line 152a of pixels that are adjacent in the row direction may be connected to the same upper second scan line 152b. The scan signal GI applied to the upper second scan line 152b may be applied to the gate electrode of the fourth transistor T4 through the second lower scan line 152a.

The upper emission control line 155b may overlap at least a portion of the lower emission control line 155a, and may be connected to the lower emission control line 155a. The upper emission control line 155b and the lower emission control line 155a may be connected by the seventh connection electrode 6175. The upper emission control line 155b constitutes the emission control line 155 together with a lower emission control line 155a. The upper emission control line 155b may extend substantially in the row direction, and may extend from a first end of the substrate 110 to a second end of the substrate 110. The lower emission control line 155a of pixels that are adjacent in the row direction may be connected to the same upper emission control line 155b. The emission control signal EM applied to the upper emission control line 155b may be applied to the gate electrode of the fifth transistor T5 and the gate electrode of the sixth transistor T5 through the lower emission control line 155a.

The initialization voltage line 127 may extend substantially in the row direction, and may extend from the first end of the substrate 110 to the second end of the substrate 110. Pixels that are adjacent in the row direction may be connected to the same initialization voltage line 127. The initialization voltage Vint applied to the initialization voltage line 127 may be applied to the first region of the fourth transistor T4 of the fourth transistor T4 and the second region of the seventh transistor T7 through the third connection electrode 3175.

The first data conductor may further include a data line connection electrode 171a, an auxiliary driving voltage line 172a, and a tenth connection electrode 6177.

The data line connection electrode 171a may overlap and may be connected to the second connection electrode 2175. The data line connection electrode 171a may be connected to the first region of the second transistor T2 through the second connection electrode 2175.

The auxiliary driving voltage line 172a may overlap and may be connected to the sixth connecting electrode 5175. The auxiliary driving voltage line 172a may extend substantially in the row direction, and may extend from the first end of the substrate 110 to the second end of the substrate 110. Pixels that are adjacent in the row direction may be connected to the same auxiliary driving voltage line 172a.

The tenth connection electrode 6177 may overlap and may be connected to the seventh connection electrode 6175 and the ninth connection electrode 7175. The tenth connection electrode 6177 may be connected to the second region of the sixth transistor T6 through the seventh connection electrode 6175. The tenth connection electrode 6177 may be connected to the first region of the seventh transistor T7 through the ninth connection electrode 7175. Accordingly, the tenth connection electrode 6177 may connect the sixth transistor and the seventh transistor.

A third interlayer insulating layer 163 may be disposed on the first data conductor including the first upper scan line 151b, the upper second scan line 152b, the upper emission control line 155b, and the initialization voltage line 127. The third interlayer insulating layer 163 may include a general purpose polymer such as poly(methyl methacrylate) (PMMA) or polystyrene (PS), a polymer derivative having a phenolic group, an organic insulating material such as an acrylic polymer, an imide polymer, a polyimide, an acrylic polymer, a siloxane polymer, etc.

Figure 9A:
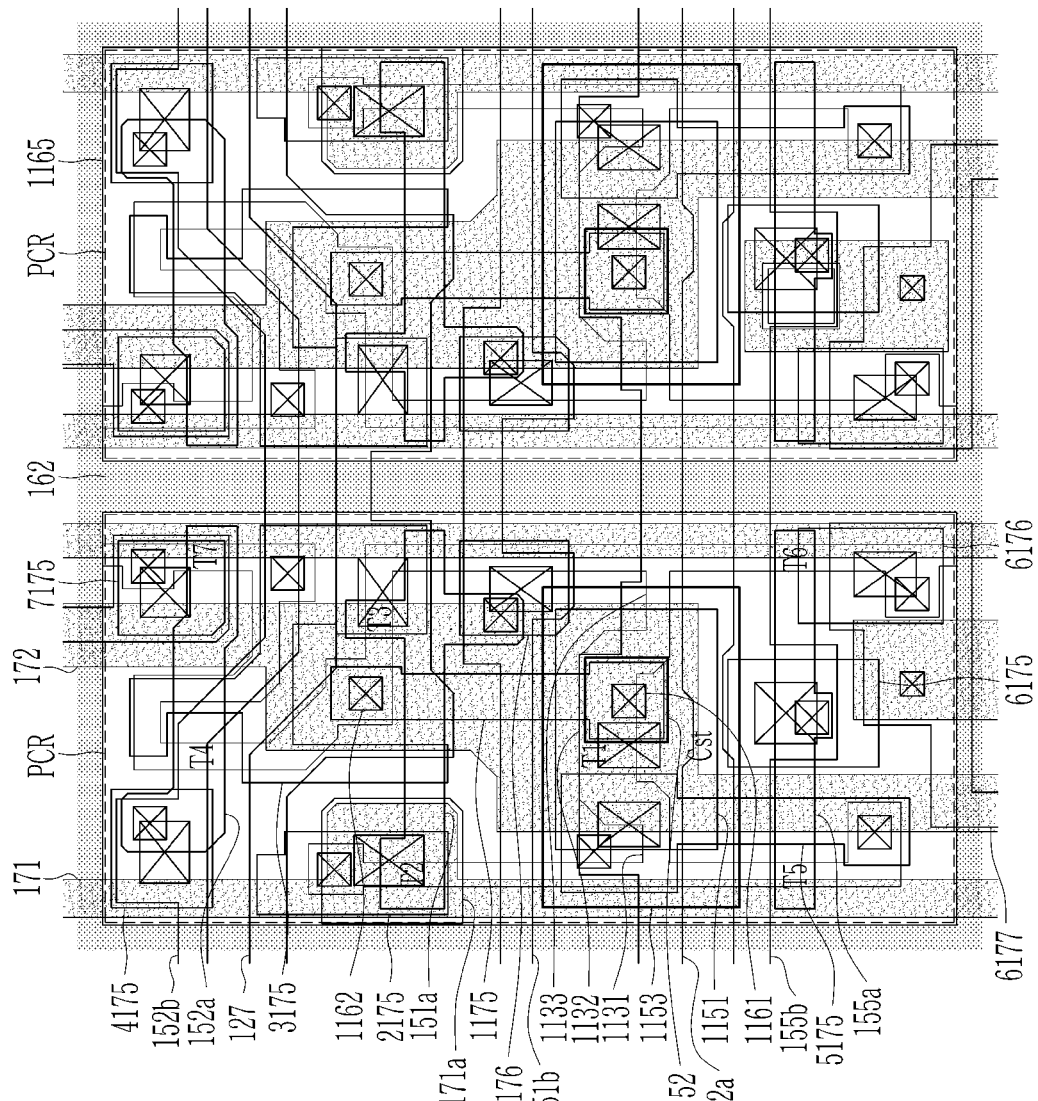
Figure 9B:
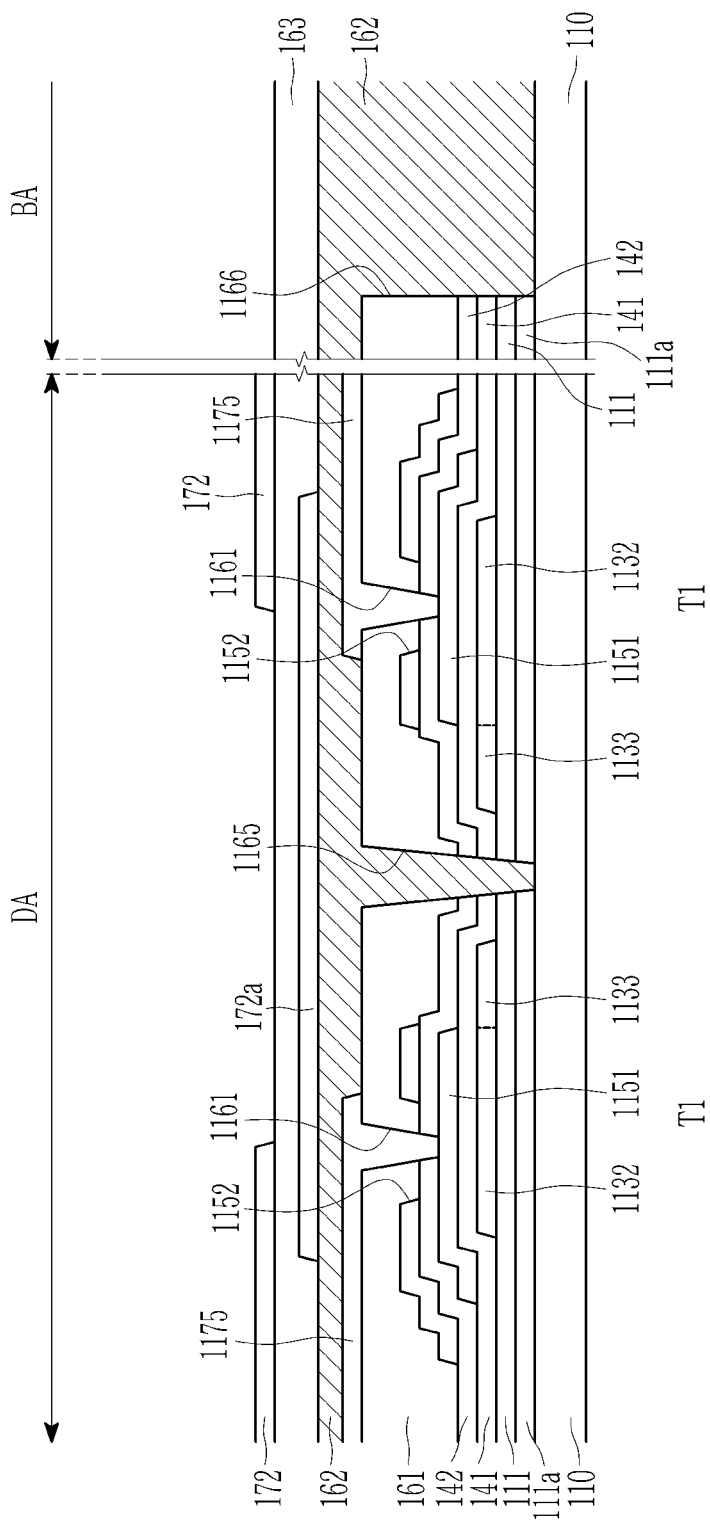

A second data conductor including the data line 171 and the driving voltage line 172 may be disposed on the third interlayer insulating layer 163. FIG. 9A and FIG. 9B illustrate the semiconductor layer 1130, the first gate conductor, the second gate conductor, the third gate conductor, the first data conductor, and the second data conductor together. The second data conductor may have a single or multi-layered structure. The second data conductor may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), or copper (Cu), etc.

The data line 171 may overlap and may be connected to the data line connection electrode 171a. The data line 171 may be connected to the first region of the second transistor T2 through the data line connection electrode 171a and the second connection electrode 2175. The data line 171 may extend substantially in the column direction, and may extend from the first end of the substrate 110 to the second end of the substrate 110. Pixels that are adjacent in the column direction may be connected to the same data line 171.

The driving voltage line 172 may cross and overlap and may be connected to the auxiliary driving voltage line 172a. The driving voltage line 172 may be connected to the first region of the first storage electrode 1153 and the fifth transistor T5 through the auxiliary driving voltage line 172a and the sixth connection electrode 5175. The driving voltage line 172 may extend substantially in the column direction, and may extend from the first end of the substrate 110 to the second end of the substrate 110. Pixels that are adjacent in the column direction may be connected to the same driving voltage line 172.

As illustrated in FIG. 3B, a passivation layer 180 may be disposed on the driving voltage line 172 The passivation layer 180 (FIG. 3B) may be disposed on the data line 171 (FIG. 3A) because the data line 171 and the driving voltage line lie 172 in the same plane. An anode 191 may be positioned on the passivation layer 180. The passivation layer 180 may include a general purpose polymer such as poly(methyl methacrylate) (PMMA) or polystyrene (PS), a polymer derivative having a phenolic group, an organic insulating material such as an acrylic polymer, an imide polymer, a polyimide, an acrylic polymer, a siloxane polymer, etc. The anode 191 may be connected to the sixth transistor T6, and may receive an output current of the first transistor T1. A partition wall 350 may be disposed on the anode 191. A pixel opening 351 may be formed in the partition wall 350, and the pixel opening 351 of the partition wall 350 may overlap the anode 191. A light emitting diode layer 370 may be disposed within the pixel opening 351 of the partition wall 350. The light emitting diode layer 370 may overlap the anode 191. A spacer 360 may be positioned on the partition wall 350. The spacer 360 may be positioned at a boundary between adjacent pixel circuit regions PCR. A cathode 270 may be positioned on the light emitting diode layer 370, the partition wall 350, and the spacer 360. The anode 191, the light emitting diode layer 370, and the cathode 270 may constitute a light emitting diode LED.

Figure 10A:
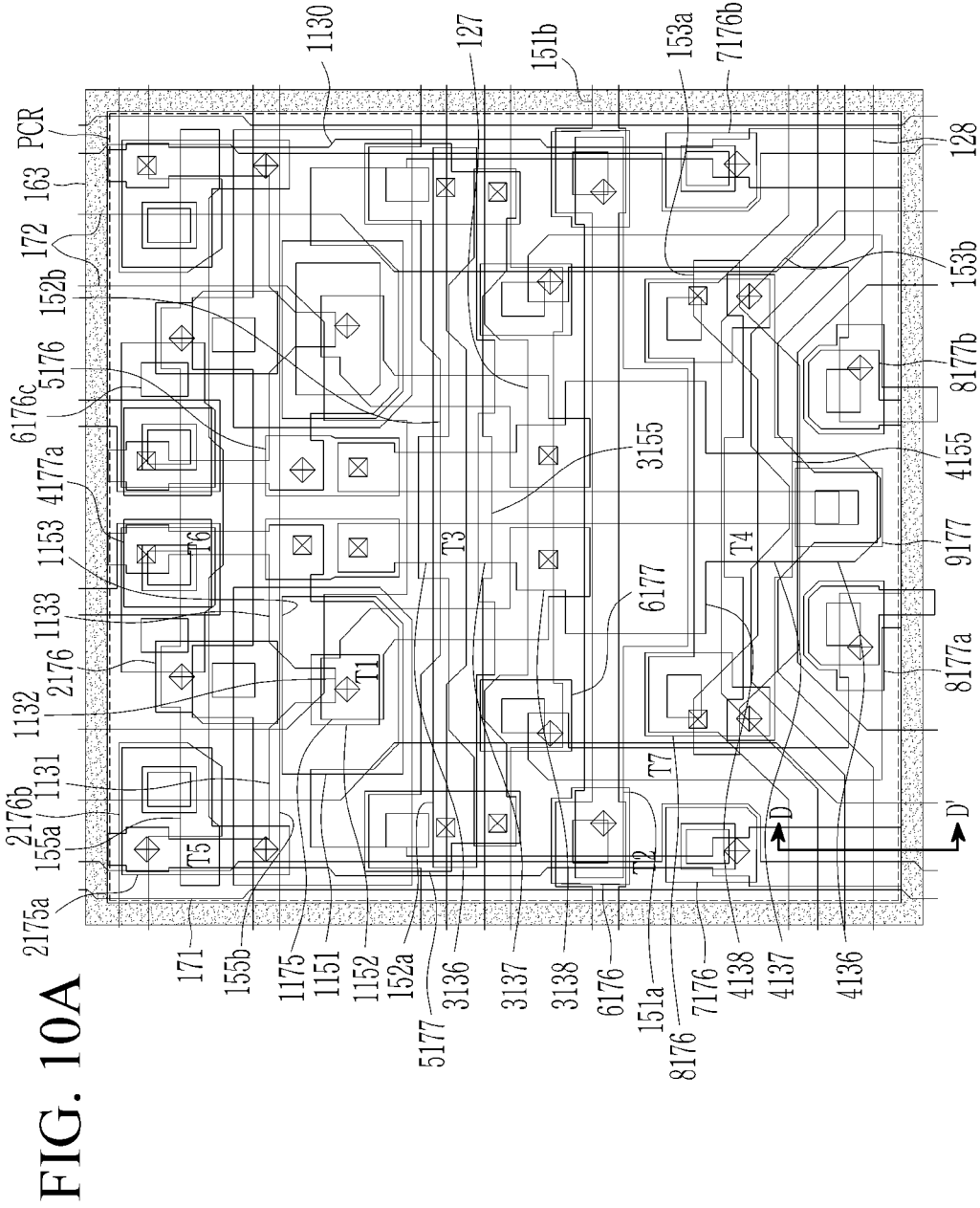
FIG. 10A partially illustrates a top plan view of a display device according to an embodiment.
Figure 10B:
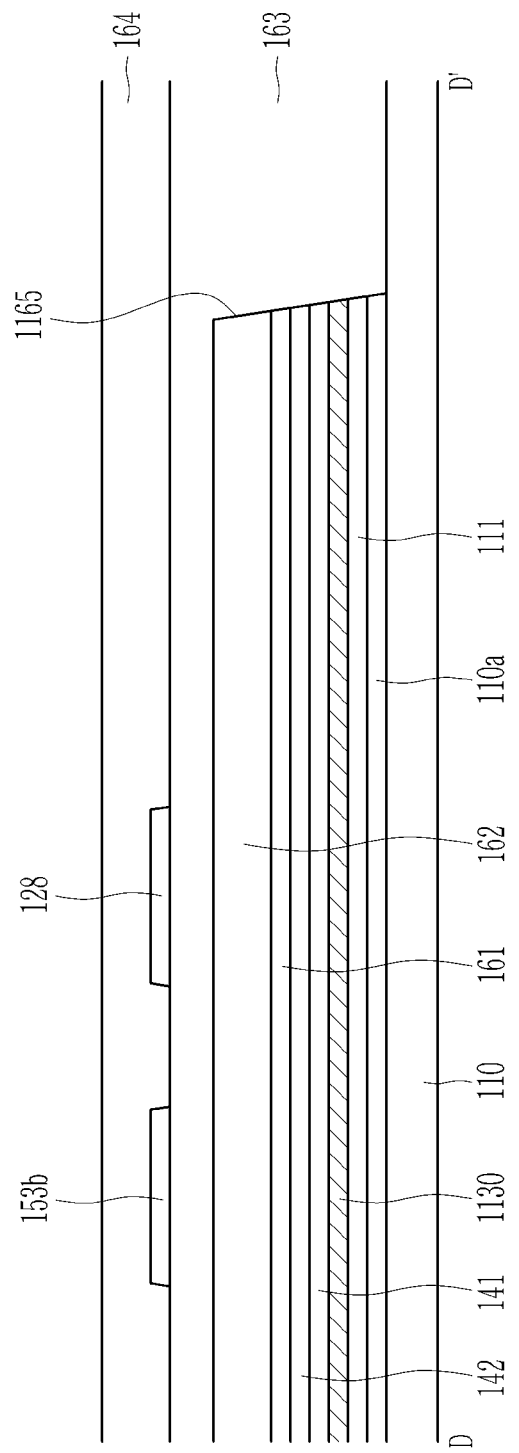
FIG. 10B illustrates a cross-sectional view showing a portion of a display device according to an embodiment.

Hereinafter, a structure of one pixel of a display device according to an embodiment will be described with reference to FIG. 10A to FIG. 18. FIG. 10A partially illustrates a top plan view of a display device according to an embodiment, FIG. 10B illustrates a cross-sectional view showing a portion of a display device according to an embodiment, and FIG. 11, FIG. 12, FIG. 13, FIG. 14, FIG. 15, FIG. 16, FIG. 17, and FIG. 18 each illustrate a cross-sectional view showing some constituent elements of a display device according to an embodiment. As an example, a configuration included in one pixel circuit region is illustrated. FIG. 10A illustrates two adjacent pixels, and the two pixels may have shapes that are symmetrical to each other. However, the present invention is not limited thereto, and two pixels may have asymmetric shapes. In this case, two adjacent pixels may have substantially a same shape. That is, pixels having a same shape may be repeatedly disposed. Hereinafter, a pixel positioned at a left side will be mainly described. In addition, in the case of the seventh transistor T7, since it is connected to the first scan line 151 of a previous stage, the illustration thereof is omitted, and the seventh transistor T7 of a next stage is illustrated instead.

Figure 11:
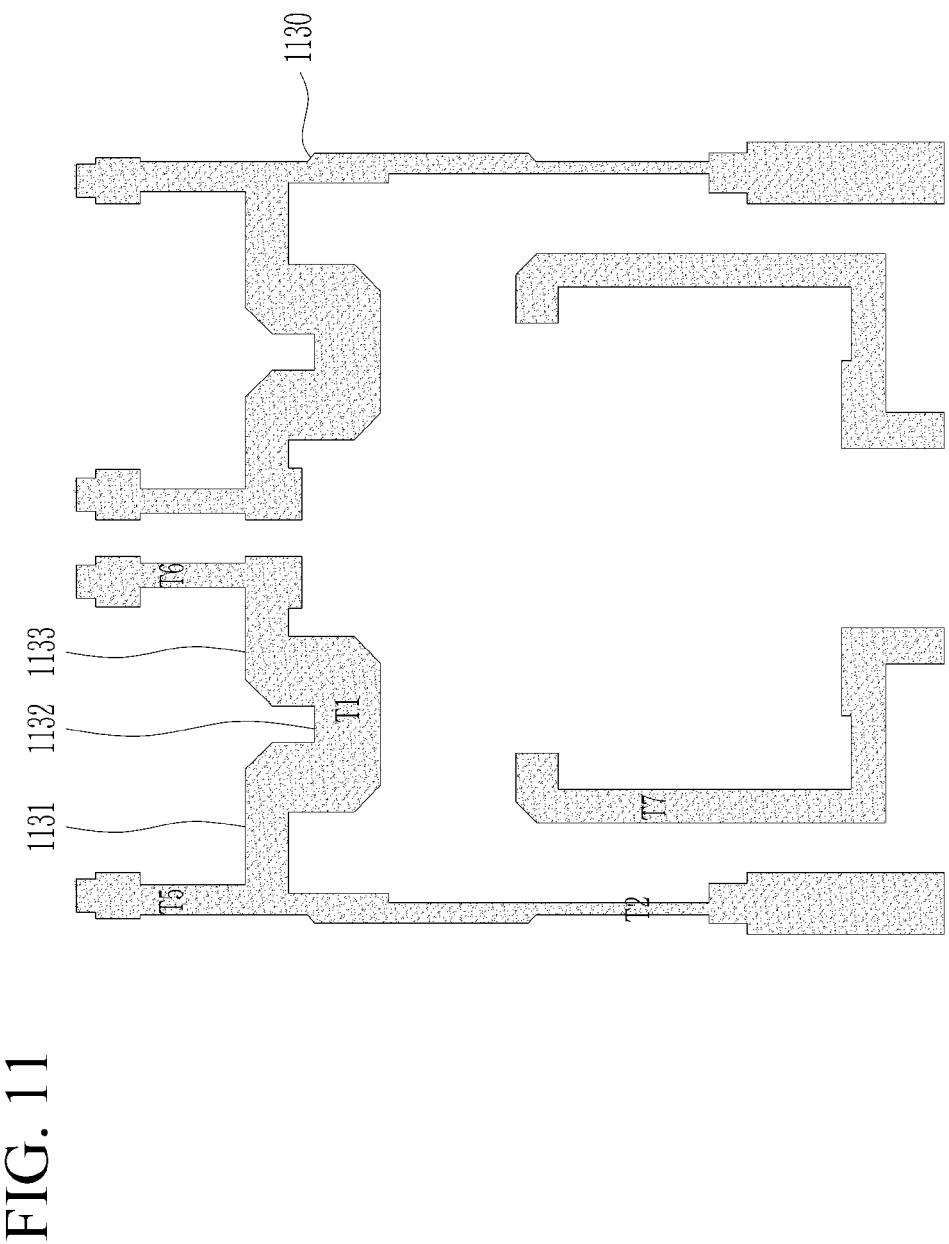
FIG. 11, FIG. 12, FIG. 13, FIG. 14, FIG. 15, FIG. 16, FIG. 17, and FIG. 18 each illustrate a cross-sectional view showing some constituent elements of a display device according to an embodiment.

A polycrystalline semiconductor layer 1130 including a channel 1132, a first electrode 1131, and a second electrode 1133 of the driving transistor T1 may be positioned on the substrate 110. FIG. 11 illustrates the polycrystalline semiconductor layer. The polycrystalline semiconductor layer 130 may further include a channel, a first electrode, and a second region of each of the second transistor T4, the fifth transistor T5, the six transistor T6, and the seventh transistor T7 as well as the driving transistor T1.

The channel 1132 of the driving transistor T1 may have a bent shape in a plan view. However, the shape of the channel 1132 of the driving transistor T1 is not limited thereto, and may be variously changed. For example, the channel 1132 of the driving transistor T1 may be bent in a different shape, or may be formed in a bar-like shape. The first electrode 1131 and the second electrode 1133 of the driving transistor T1 may be positioned at opposite sides of the channel 1132 of the driving transistor T1. The first electrode 1131 of the driving transistor T1 extends upward and downward in a plan view, a portion extending downward may be connected to the second electrode of the second transistor T2, and a portion extending upward may be connected to the second electrode of the fifth transistor T5. The second electrode 1133 of the driving transistor T1 may extend upward in a plan view to be connected to the first electrode of the sixth transistor T6.

The buffer layer 111 may be disposed between the substrate 110 and the polycrystalline semiconductor layer including the channel 1132, the first electrode 1131, and the second electrode 1133 of the driving transistor T1. The buffer layer 111 may have a single or multi-layered structure The buffer layer 111 may include an inorganic insulating material or organic insulating material such as a silicon nitride ($SiN_x$), a silicon oxide ($SiO_x$), and a silicon oxynitride ($SiO_xN_y$).

In addition, a barrier layer 110a may be further disposed between the substrate 110 and the buffer layer 111. The barrier layer 110a may have a single or multi-layered structure. The barrier layer 110a may include an inorganic insulating material such as a silicon nitride ($SiN_x$), a silicon oxide ($SiO_x$), and a silicon oxynitride ($SiO_xN_y$).

A first gate insulating layer 141 may be disposed on the polycrystalline semiconductor layer 1130 including the channel 1132, the first electrode 1131, and the second electrode 1133 of the driving transistor T1. The first gate insulating layer 141 may have a single or multi-layered structure. The first gate insulating layer 141 may include an inorganic insulating material such as a silicon nitride ($SiN_x$), a silicon oxide ($SiO_x$), and a silicon oxynitride ($SiO_xN_y$).

Figure 12:
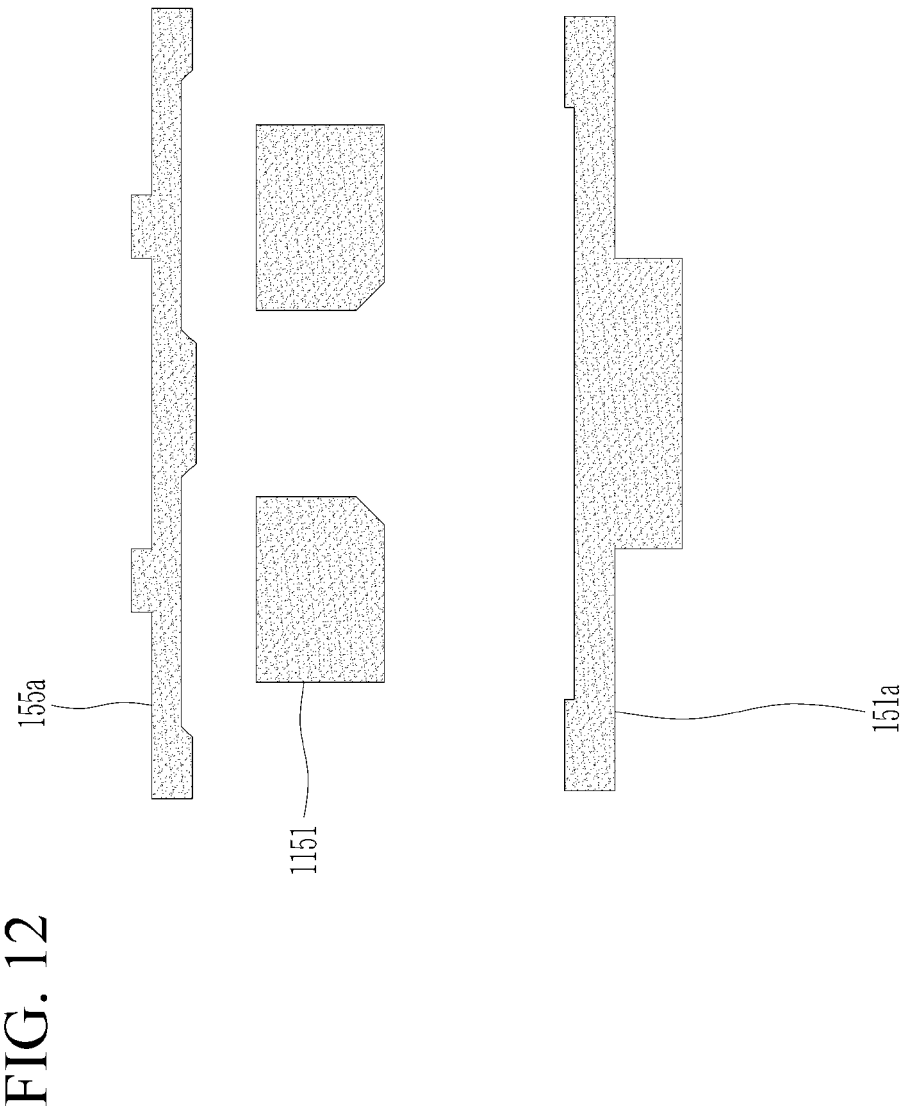

A first gate conductor including a gate electrode 1151 of the driving transistor T1 may be positioned on the first gate insulating layer 141. FIG. 12 illustrates the first gate conductor. The first gate conductor may have a single or multi-layered structure. The first gate conductor may include a metal material such as molybdenum (Mo), aluminum (Al), copper (Cu), or titanium (Ti). The gate conductor may further include a gate electrode of each of the second transistor T2, the fifth transistor T5, the transistor T6, and the seventh transistor T7 as well as the driving transistor T1.

The gate electrode 1151 of the driving transistor T1 may overlap the channel 1132 of the driving transistor T1. The channel 1132 of the driving transistor T1 may overlap the electrode channel 1151 of the driving transistor T1.

The first gate conductor may further include a first lower scan line 152a and a lower emission control line 155a. The first lower scan line 151a and the lower emission control line 155a may extend substantially in a horizontal direction. The first lower scan line 151a may be connected to the gate electrode of the second transistor T2. The first lower scan line 151a may be integrally formed with the gate electrode of the second transistor T2. The first lower scan line 151a may be connected to the gate electrode of the seventh transistor T7 positioned in a pixel of a next stage. That is, the bypass control line connected to the seventh transistor T7 may be formed as the first lower scan line 151a of a previous stage. The gate electrode of the fifth transistor T5 and the gate electrode of the sixth transistor T6 may be connected to the lower emission control line 155a.

After the first gate conductor including the gate electrode 1151 of the driving transistor T1 is formed, a doping process may be performed. The polycrystalline semiconductor layer that is covered by the first conductive layer may be doped, and a portion of the polycrystalline semiconductor layer that is not covered by the first conductive layer may be doped to have a same characteristic as that of a conductor. In this case, the doping process may be performed with a P-type dopant, and the first transistor T1, the second transistor T2, the third transistor T1, the second transistor T2, the fifth transistor T5, the sixth transistor T6, and the seventh transistor T7 may have a P-type transistor characteristic.

A second gate insulating layer 142 may be disposed on the first gate insulating layer 141 and the first gate conductor including the gate electrode 1151 of the driving transistor T1. The second gate insulating layer 142 may have a single or multi-layered structure. The second gate insulating layer 142 may include an inorganic insulating material such as a silicon nitride ($SiN_x$), a silicon oxide ($SiO_x$), and a silicon oxynitride ($SiO_xN_y$).

Figure 13:
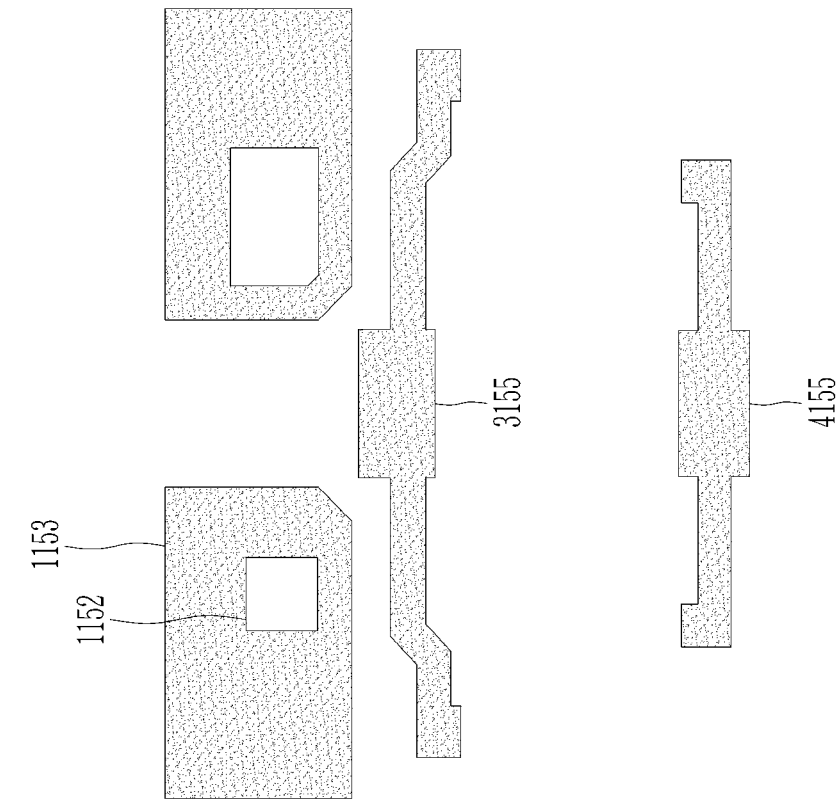

A second gate conductor including a first storage electrode 1153 of the storage capacitor Cst, a light blocking layer 3155 of the third transistor T3, and a light blocking layer 4155 of the fourth transistor T4 may be positioned on the second gate insulating layer 142. FIG. 13 illustrates the second gate conductor. The second gate conductor may have a single or multi-layered structure. The second gate conductor may include a metal material such as molybdenum (Mo), aluminum (Al), copper (Cu), or titanium (Ti).

The first storage electrode 1153 overlaps the gate electrode 1151 of the driving transistor T1 to constitute the storage capacitor Cst. An opening 1152 is formed in the first storage electrode 1153 of the storage capacitor Cst. The opening 1152 of the first storage electrode 1153 of the storage capacitor Cst may overlap the gate electrode 1151 of the driving transistor T1. The light blocking layer 3155 of the third transistor T3 may overlap the channel 3137 and the gate electrode of the third transistor T3. The light blocking layer 4155 of the fourth transistor T4 may overlap the channel 4137 and the gate electrode of the fourth transistor T4.

A first interlayer insulating layer 161 may be positioned on the second gate conductor including the first storage electrode 1153 of the storage capacitor Cst, the light blocking layer 3155 of the third transistor T3, and the light blocking layer 4155 of the fourth transistor T4. The first interlayer insulating layer 161 may have a single or multi-layered structure. The first interlayer insulating layer 161 may include an inorganic insulating material such as a silicon nitride ($SiN_x$), a silicon oxide ($SiO_x$), and a silicon oxynitride ($SiO_xN_y$).

Figure 14:
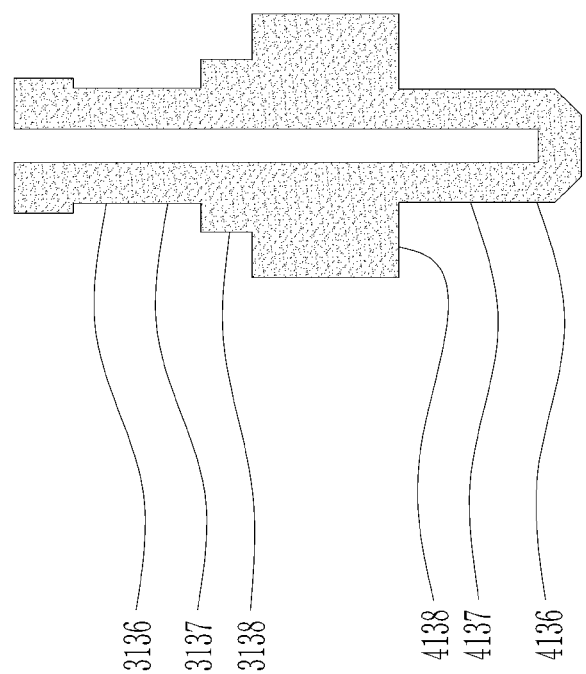

An oxide semiconductor layer including the channel 3137, the first electrode 3136, and the second electrode 3138 of the third transistor T3, and the channel 4137, the first electrode 4136, and the second electrode 4138 of the fourth transistor T4, may be positioned on the first interlayer insulating layer 161. FIG. 14 illustrates the oxide semiconductor layer.

The oxide semiconductor layer may include at least one of a primary metal-based oxide such as an indium oxide, a tin oxide, or a zinc oxide, a binary metal-based oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a ternary metal-based oxide such as an In—Ga—Zn-based oxide, an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, and a quaternary metal-based oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide. For example, the oxide semiconductor layer may include an indium-gallium-zinc oxide (IGZO) among In—Ga—Zn-based oxides.

The channel 3137, the first electrode 3136, and the second electrode 3138 of the third transistor T3, and the channel 4137, the first electrode 4136, and the second electrode 4138 of the fourth transistor T4, may be connected to each other to be formed integrally. The first electrode 3136 and the second electrode 3138 of the third transistor T3 may be positioned at opposite sides of the channel 3137 of the third transistor T3. The first electrode 4136 and the second electrode 4138 of the fourth transistor T4 may be positioned at opposite sides of the channel 4137 of the fourth transistor T4. The second electrode 3138 of the third transistor T3 may be connected to the second electrode 4138 of the fourth transistor T4. The channel 3137 of the third transistor T3 may overlap the light blocking layer 3155. The channel 4137 of the fourth transistor T4 may overlap the light blocking layer 4155.

A third gate insulating layer (not illustrated) may be positioned on the oxide semiconductor layer including the channel 3137, the first electrode 3136, and the second electrode 3138 of the third transistor T3, and the channel 4137, the first electrode 4136, and the second electrode 4138 of the fourth transistor T4. The third gate insulating layer may overlap the channel 3137 of the third transistor T3, and may not overlap the first electrode 3136 and the second electrode 3138. In addition, the third gate insulating layer may overlap the channel 4137 of the fourth transistor T4, and not overlap the first electrode 4136 and the second electrode 4138. However, the present invention is not limited thereto, and the third gate insulating layer 143 may be provided to overlap an entire surface of the substrate 110. The third gate insulating layer 143 may have a single or multi-layered structure. The third gate insulating layer 143 may include an inorganic insulating material such as a silicon nitride ($SiN_x$), a silicon oxide ($SiO_x$), and a silicon oxynitride ($SiO_xN_y$).

Figure 15:
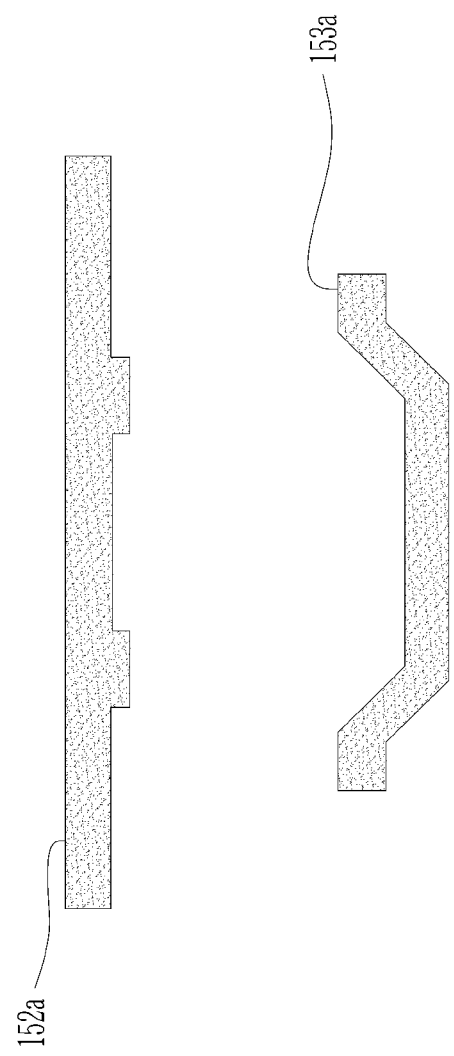

A third gate conductor including the gate electrode of the third transistor T3 and the gate electrode of the fourth transistor T4 may be positioned on the third gate insulating layer 143. FIG. 15 illustrates the third gate conductor. The third gate conductor may have a single or multi-layered structure. The third gate conductor may include a metal material such as molybdenum (Mo), aluminum (Al), copper (Cu), or titanium (Ti).

A third gate conductor including a second lower scan line 152a and a lower initialization control line 153a may be positioned on the third gate insulating layer 143. FIG. 15 illustrates the third gate conductor. The third gate conductor may have a single or multi-layered structure. The third gate conductor may include a metal material such as molybdenum (Mo), aluminum (Al), copper (Cu), or titanium (Ti).

The second lower scan line 152a and the lower initialization control line 153a may extend substantially in a horizontal direction. The second lower scan line 152a may overlap the channel 3137 of the third transistor T3. The second lower scan line 152a may overlap the light blocking layer 3155 of the third transistor T3. The lower initialization control line 153a may overlap the channel 4137 of the fourth transistor T4. The lower initialization control line 153a may overlap the light blocking layer 4155 of the fourth transistor T4.

After the third gate conductor including the gate electrode of the third transistor T3 and the gate electrode of the fourth transistor T4 is formed, a doping process may be performed. A portion of the oxide semiconductor layer covered by the third gate conductor may not be doped, and a portion of the oxide semiconductor layer not covered by the third gate conductor may be doped to have a same characteristic as the conductor. The doping process of the oxide semiconductor layer may be performed with an N-type dopant, and the third transistor T3 and the fourth transistor T4 including the oxide semiconductor layer may have an N-type transistor characteristic.

A second interlayer insulating layer 162 may be disposed on the third gate conductor. The second interlayer insulating layer 162 may have a single or multi-layered structure. The second interlayer insulating layer 162 may include an inorganic insulating material such as a silicon nitride ($SiN_x$), a silicon oxide ($SiO_x$), and a silicon oxynitride ($SiO_xN_y$).

Figure 16:
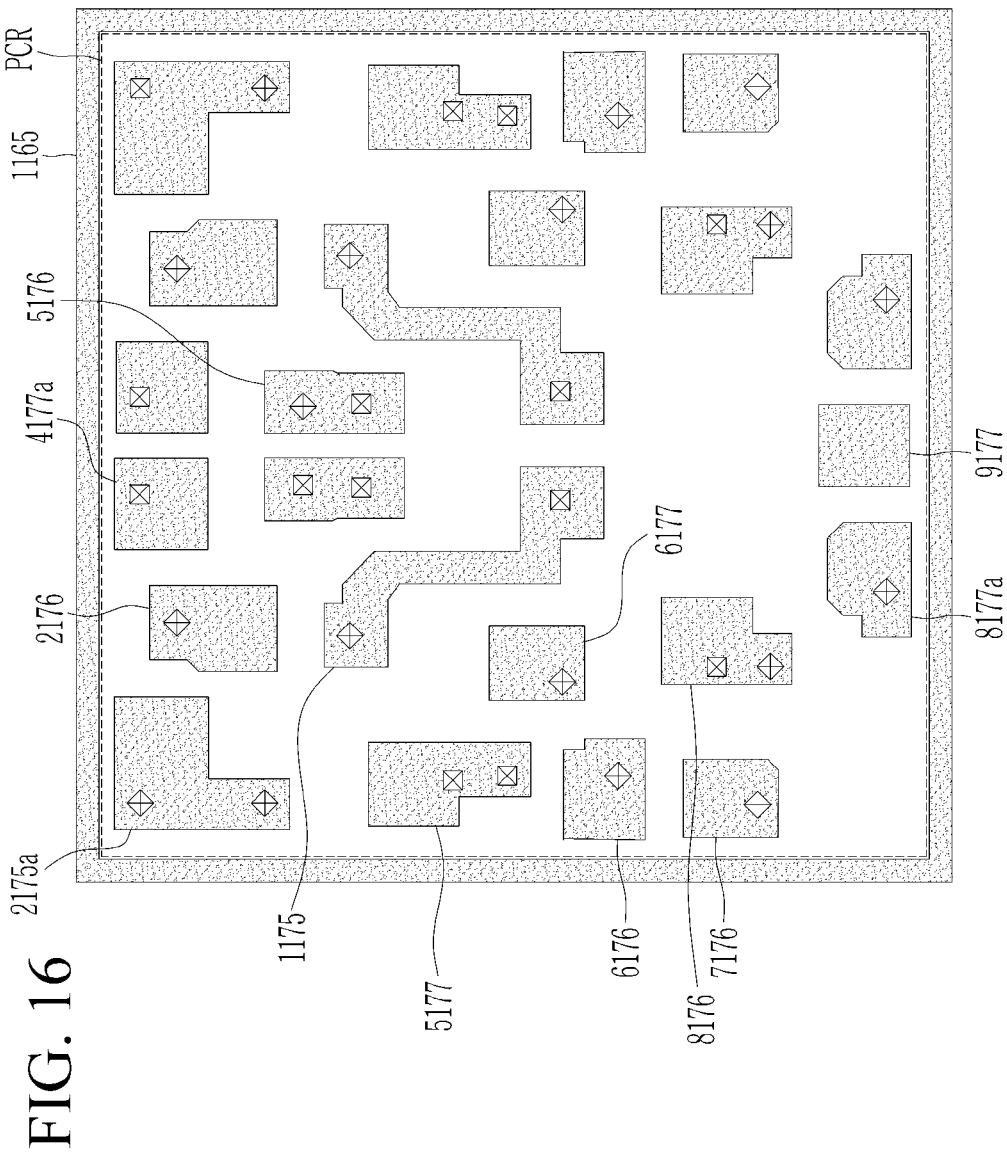
Figure 17:
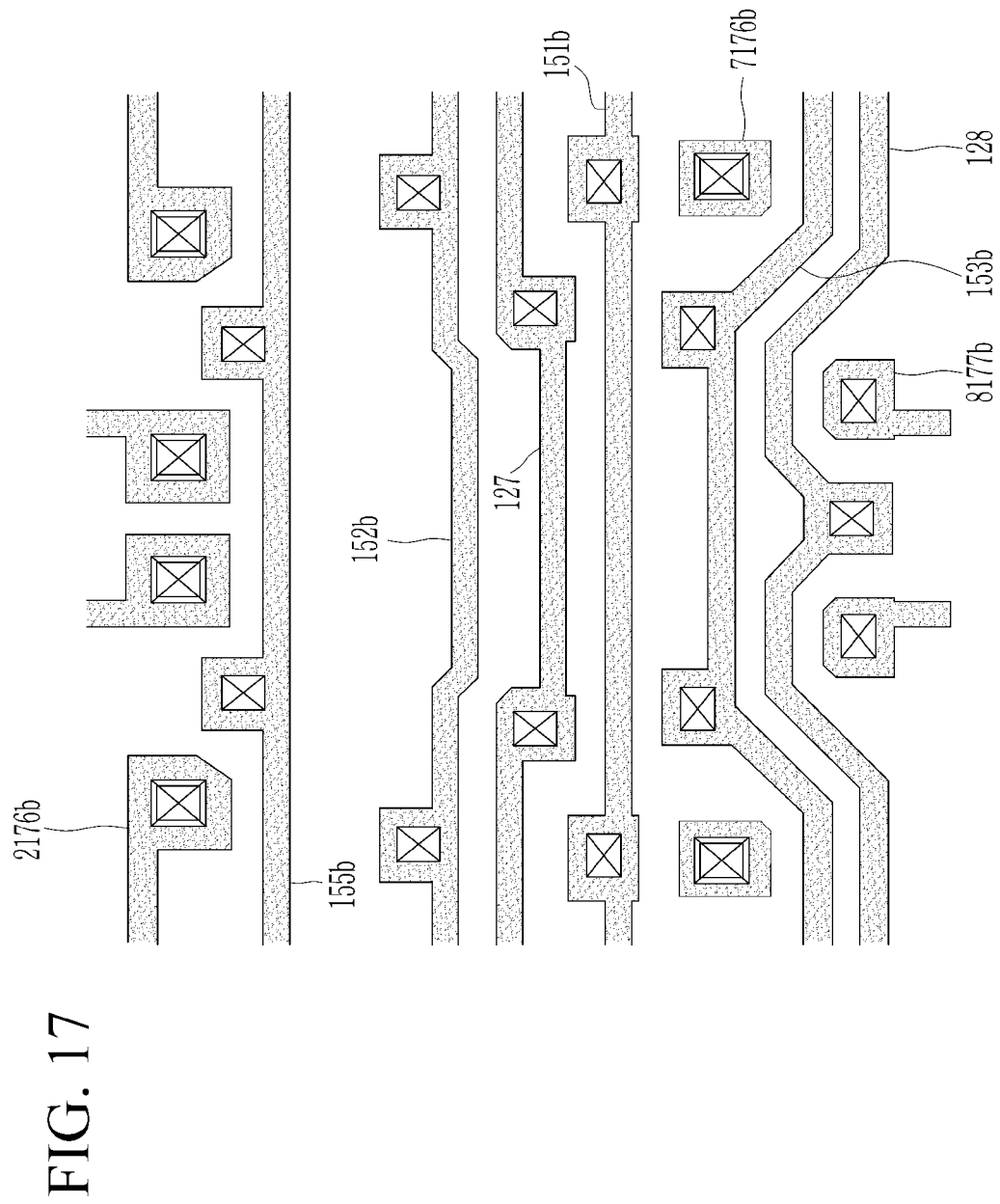
Figure 18:
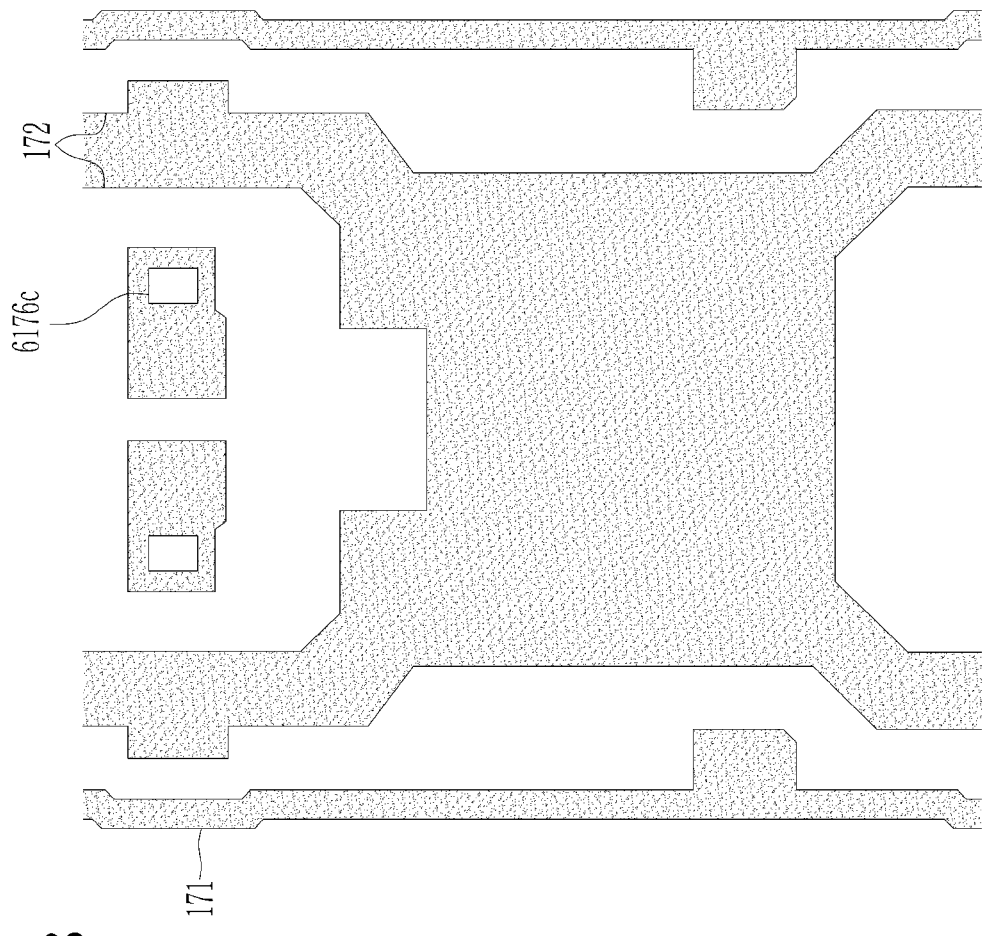

A fourth gate conductor including a plurality of connection electrodes may be positioned on the second interlayer insulating layer 162. FIG. 16 illustrates the fourth gate conductor. The fourth gate conductor may have a single or multi-layered structure. The fourth gate conductor may include a metal material such as molybdenum (Mo), aluminum (Al), copper (Cu), or titanium (Ti).

The first connection electrode 1175 may electrically connect the gate electrodes of the third transistor T3 and the first transistor T1 to each other. The second connection electrode 2175a may electrically connect the driving voltage line 172 to the fifth transistor T5. The third connection electrode 2176 may connect the lower emission control line 155a and the upper emission control line 155b. The fourth connection electrode 4177a may be connected to the sixth transistor T6. The fifth connection electrode 5177 may connect the second lower scan line 152a and the upper second scan line 152b. The sixth connection electrode 5176 may connect the third transistor T3 to one electrode of the first transistor T1. The seventh connection electrode 6176 may connect the first lower scan line 151a and the first upper scan line 151b. The eighth connection electrode 7176 may connect the data line 171 to the second transistor T2. The ninth connection electrode 8176 may connect the lower initialization control line 153a and the upper initialization control line 153b. The tenth connection electrode 8177a may connect the seventh transistor T7 to the sixth transistor T6. The eleventh connection electrode 9177 may connect the second initialization voltage line 128b to the fourth transistor T4.

The first connection electrode 1175 to the tenth connection electrode 9177 may be positioned in one pixel circuit region PCR. The pixel circuit region PCR may be formed to have an approximately quadrangular shape. However, the shape of the pixel circuit region PCR is not limited thereto, and may be variously changed. Two adjacent pixels may form one pixel circuit region PCR.

The second interlayer insulating layer 162 may include an opening 1165, and a plurality of pixel circuit regions PCR may be divided by the opening 1165. That is, the opening 1165 may be positioned between the plurality of pixel circuit regions PCR, and may be formed to surround an edge of the pixel circuit region PCR. The opening 1165 may be formed not only in the second interlayer insulating layer 162 but also in the first interlayer insulating layer 161, the first gate insulating layer 141, and the second gate insulating layer 142. In addition, the opening 1165 may be formed in the second interlayer insulating layer 162, the first interlayer insulating layer 161, the second gate insulating layer 142, the first gate insulating layer 141, and the buffer layer 111. In addition, the opening 1165 may be formed in the second interlayer insulating layer 162, the first interlayer insulating layer 161, the second gate insulating layer 142, the first gate insulating layer 141, and the buffer layer 111. The opening 1165 may extend through the second interlayer insulating layer 162, the first interlayer insulating layer 161, the second gate insulating layer 142, the first gate insulating layer 141, and the buffer layer 111. The opening 1165 may have a cross-section width that decreases toward the substrate 110. That is, an area occupied by the opening 1165 may decrease toward the substrate 110.

Semiconductor layers, first gate conductors, second gate conductors, third gate conductors, and fourth gate conductors positioned in different pixel circuit regions PCR are not directly connected to each other, but are spaced apart from each other. In this case, at least a portion of the semiconductor layer 1130 positioned in one pixel circuit region PCR may extend to the opening 1165 dividing the pixel circuit region PCR. The semiconductor layer 1130 may contact the opening 1165.

A third interlayer insulating layer 163 may be disposed on the fourth gate conductor including a plurality of connection electrodes. The third interlayer insulating layer 163 may be formed to fill the opening 1165. The pixel circuit regions PCR may be divided by the third interlayer insulating layer 163. That is, the third interlayer insulating layer 163 may be positioned between the plurality of pixel circuit regions PCR, and may be formed to surround an edge of the pixel circuit region PCR. Each pixel may be formed to have an island shape by forming the opening 1165 in the second interlayer insulating layer 162, the first interlayer insulating layer 161, the second gate insulating layer 142, and the first gate insulating layer 141 made of an inorganic material and positioning the third interlayer insulating layer 163 made of an organic material within the opening 1165. Accordingly, even when an impact is applied from the outside and damage the insulating layer, etc. occurs, the pixel circuit region PCR has an independent structure by the third interlayer insulating layer 163 made of an organic material, and thus it is possible to prevent affecting other adjacent pixels. That is, it is possible to prevent cracks generated in any one region from propagating in the horizontal direction.

The third interlayer insulating layer 163 filling the opening 1165 may directly contact a portion of the semiconductor layer 1130 extending to the opening 1165. During a manufacturing process, semiconductor layers 1130 positioned in different pixel circuit regions PCR may be integrally formed. However, a portion of the semiconductor layer 1130 may be removed in a process of forming the opening 1165 penetrating the second interlayer insulating layer 162, the first interlayer insulating layer 161, the second gate insulating layer 142, the first gate insulating layer 141, the buffer layer 111, and the barrier layer 110b. Then, the opening 1165 may be filled with the third interlayer insulating layer 163. Accordingly, the semiconductor layer 1130 may be independently positioned in one pixel circuit region PCR, and the semiconductor layers 1130 positioned in the adjacent pixel circuit region PCR may be spaced apart from each other by the opening 1165. In addition, since semiconductor layers positioned in a plurality of pixel circuit regions PCR are connected to each other during the manufacturing process, it is possible to prevent static electricity from occurring.

A first data conductor may be positioned on the third interlayer insulating layer 163. The first data conductor includes the upper emission control line 155b, the upper second scan line 152b, the first initialization voltage line 127, the first upper scan line 151b, the eleventh connection electrode 7176b, the upper initialization voltage line 153b, the second initialization voltage line 128, and a twelfth connection electrode 8177b. A thirteenth connection electrode 2176b may connect the driving voltage line 172 and the fifth transistor T5 through the second connection electrode 2175a.

A fourth interlayer insulating layer 164 may be disposed on the first data conductor. The fourth interlayer insulating layer 164 may include a general purpose polymer such as poly(methyl methacrylate) (PMMA) or polystyrene (PS), a polymer derivative having a phenolic group, an organic insulating material such as an acrylic polymer, an imide polymer, a polyimide, an acrylic polymer, a siloxane polymer, etc.

A second data conductor including the data line 171 and the driving voltage line 172 may be disposed on the fourth interlayer insulating layer 164. The data line 171 and the driving voltage line 172 may mainly extend in the vertical direction. The data line 171 may be connected to the second transistor T2. The driving voltage line 172 may be connected to the fifth transistor T5. In addition, the driving voltage line 172 may be connected to the first storage electrode 1153.

The second data conductor may have a single or multi-layered structure. The second data conductor may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), or copper (Cu), etc.

Although not illustrated, a passivation layer may be positioned on the data line 171 and the driving voltage line 172, and an anode may be positioned on the passivation layer. The passivation layer may include a general purpose polymer such as poly(methyl methacrylate) (PMMA) or polystyrene (PS), a polymer derivative having a phenolic group, an organic insulating material such as an acrylic polymer, an imide polymer, a polyimide, an acrylic polymer, a siloxane polymer, etc. The anode may be connected to the sixth transistor T6 through a connection electrode 6176c of FIG. 18, and may receive an output current of the driving transistor T1. A partition wall may be positioned on the anode. An opening is formed in the partition wall, and the opening of the partition wall may overlap the anode. A light emitting element layer may be disposed within the opening of the partition wall. A cathode may be positioned on the light emitting element layer and the partition wall. The anode, the light emitting element layer, and the cathode constitute a light emitting diode LED.

As described above, in the display device according to an embodiment, the driving transistor T1 may include a polycrystalline semiconductor, and the third transistor T3 and the fourth transistor T4 may include an oxide semiconductor. As described above, more stable driving may be achieved and reliability may be improved by allowing the third transistor T3 and the fourth transistor T4 to include a semiconductor material different from that of the driving transistor T1.

Figure 19:
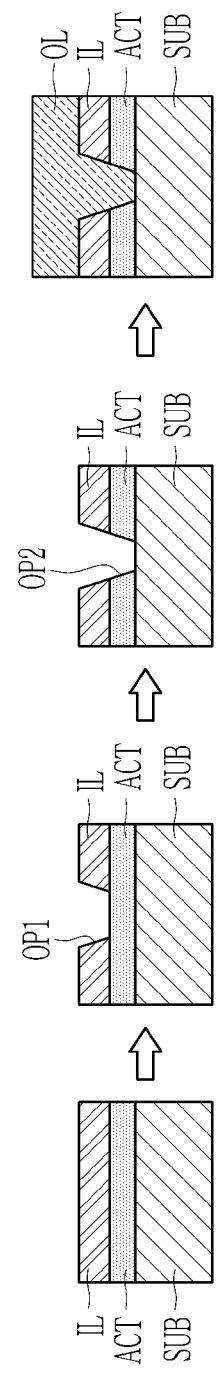
FIG. 19 is a schematic cross-sectional view according to a manufacturing method of a display device.

A manufacturing method according to an embodiment will now be described with reference to FIG. 19. FIG. 19 is a schematic cross-sectional view according to a manufacturing method of a display device.

Referring to FIG. 19, a semiconductor layers ACT included in different pixel circuit regions may be continuously formed on the substrate SUB. Thereafter, an insulating layer (IL, e.g., a gate insulating layer, etc.) including an inorganic material may be formed on an entire surface of the substrate (SUB).

Then, an opening OP1 is formed by etching a portion of the insulating layer IL, and an opening OP2 included in the semiconductor layer is formed through additional etching. In this case, the openings OP1 and OP2 may separate respective pixel circuit regions.

Thereafter, the openings OP1 and OP2 may be filled through an organic insulating layer OL. Accordingly, the semiconductor layers ACT included in the adjacent pixel circuit regions may be spaced apart from each other through the organic insulating layer OL filling the openings OP1 and OP2. However, they may have a form connected to each other during a manufacturing process, and through this, occurrence of static electricity defects may be controlled.

Figure 20:
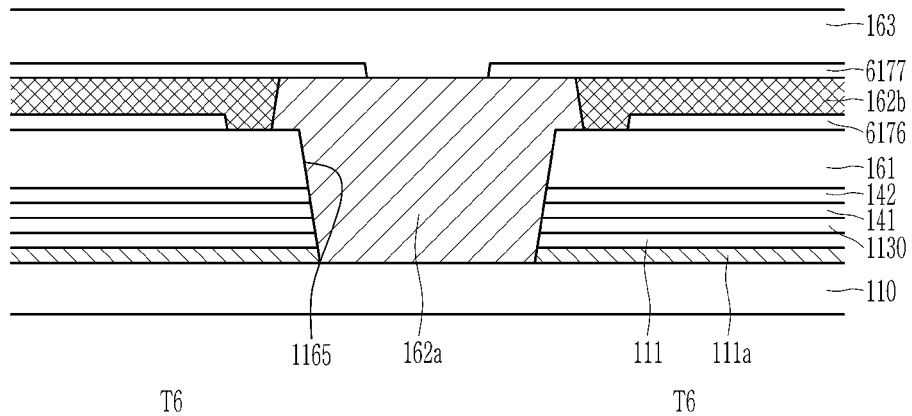
FIG. 20 illustrates a cross-sectional view of a region of a display device according to an embodiment.

A display device according to an embodiment will now be described with reference to FIG. 20. FIG. 20 illustrates a cross-sectional view of a region of a display device according to an embodiment. It has a structure similar to that of FIG. 3C, and a description of the same components will be omitted.

A second interlayer insulating layer 162a and an auxiliary passivation layer 162b may be disposed on the third gate conductive layer 6176.

According to an embodiment, the opening 1165 may be filled with the second interlayer insulating layer 162a made of an organic material. In this case, the second interlayer insulating layer 162a may be positioned only in the opening 1165, and may be substantially spaced apart from the gate electrode and the first storage electrode positioned in one pixel circuit region. Meanwhile, an auxiliary passivation layer 162b may cover the third gate conductive layer 6176. The auxiliary passivation layer 162b may include an organic material or an inorganic material.

The second interlayer insulating layer 162a and the auxiliary passivation layer 162b may provide a substantially flat upper surface. A first data conductor 6177 may be positioned on the second interlayer insulating layer 162a and the auxiliary passivation layer 162b. At least a portion of the first data conductor 6177 may be formed on the auxiliary passivation layer 162b. The third interlayer insulating layer 163 may be disposed on the first data conductor 6177.

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
a substrate;
a polycrystalline semiconductor layer disposed on the substrate including a first electrode, a channel, and a second electrode of a driving transistor;
a first gate insulating layer disposed on the polycrystalline semiconductor layer;
a gate electrode of the driving transistor positioned on the first gate insulating layer;
a second gate insulating layer disposed on the gate electrode;
a first storage electrode positioned on the second gate insulating layer;
a first interlayer insulating layer disposed on the first storage electrode;
an oxide semiconductor layer disposed on the first interlayer insulating layer;
a second interlayer insulating layer disposed on the oxide semiconductor layer to include an opening surrounding the polycrystalline semiconductor layer and the oxide semiconductor layer;
a third interlayer insulating layer configured to fill the opening of the second interlayer insulating layer; and
a data line and a driving voltage line positioned on the third interlayer insulating layer,
wherein a portion of the polycrystalline semiconductor layer is in contact with the third interlayer insulating layer filling the opening.

2. The display device of claim 1, wherein
the display device includes a plurality of pixel circuit regions,
each of the pixel circuit regions includes at least two polycrystalline semiconductor layers adjacent in a first direction, and
the pixel circuit regions are defined by the opening.

3. The display device of claim 1, wherein
a cross-section width of the opening decreases toward the substrate.

4. The display device of claim 1, further comprising
a buffer layer positioned between the substrate and the semiconductor layer,
wherein the opening extends through the second interlayer insulating layer, the first interlayer insulating layer, the second gate insulating layer, the first gate insulating layer, and the buffer layer.

5. The display device of claim 4, further comprising
a barrier layer positioned between the substrate and the buffer layer,
wherein the opening extends to the barrier layer.

6. The display device of claim 5, wherein
the opening extends through the barrier layer.

7. The display device of claim 2, wherein
the polycrystalline semiconductor layers are spaced apart from each other by the opening in adjacent pixel circuit regions, and
the polycrystalline semiconductor layer disposed in one pixel circuit region extends to an edge of the opening.

8. The display device of claim 2, further comprising:
a plurality of transistors positioned on the substrate; and
a first lower scan line, a second lower scan line, and a lower emission control line connected to at least one of the transistors,
wherein the transistors, the first lower scan line, the second lower scan line, and the lower emission control are positioned within the pixel circuit regions,
first lower scan lines positioned in different pixel circuit regions are positioned to be spaced apart from each other,
second lower scan lines positioned in different pixel circuit regions are positioned to be spaced apart from each other, and
lower emission control lines positioned in different pixel circuit regions are positioned to be spaced apart from each other,
wherein the display device further includes an first upper scan line, an upper second scan line, and an upper emission control line positioned on the third interlayer insulating layer,
the first upper scan line is connected to the first lower scan lines positioned within the different pixel circuit regions,
the upper second scan line is connected to the second lower scan lines positioned within the different pixel circuit regions, and the upper emission control line is connected to the lower emission control lines positioned in the different pixel circuit regions.

* * * * *